United States Patent

Yamaji et al.

[11] Patent Number: 5,867,777
[45] Date of Patent: Feb. 2, 1999

[54] VARIABLE-GAIN AMPLIFIER CIRCUIT, OFFSET CONTROL METHOD IN VARIABLE-GAIN AMPLIFIER CIRCUIT, RADIO RECEIVER WITH VARIABLE-GAIN AMPLIFIER CIRCUIT, AND RADIO RECEIVING METHOD IN RADIO RECEIVER WITH VARIABLE-GAIN AMPLIFIER

[75] Inventors: Takafumi Yamaji, Ichikawa; Tetsuro Itakura, Tokyo; Hiroshi Tsurumi, Kawasaki, all of Japan

[73] Assignee: Kabushiki Kaisha Toshiba, Kawasaki, Japan

[21] Appl. No.: 702,154

[22] Filed: Aug. 23, 1996

[30] Foreign Application Priority Data

Aug. 25, 1995 [JP] Japan ................................. 7-217948

[51] Int. Cl.$^6$ .................................................. H04B 1/16
[52] U.S. Cl. .................................. 455/234.1; 455/240.1; 455/249.1; 455/340; 330/9
[58] Field of Search .............................. 455/231, 232.1, 455/234.1, 234.2, 236.1, 249.1, 240.1, 334, 338, 340, 341; 330/9

[56] References Cited

U.S. PATENT DOCUMENTS

| | | | |
|---|---|---|---|
| 4,404,525 | 9/1983 | Amir et al. | 330/9 |
| 4,479,253 | 10/1984 | Daniel, Jr. | 455/246.1 X |
| 4,565,971 | 1/1986 | Brookshire | 330/9 |
| 5,124,663 | 6/1992 | McEntarfer et al. | 330/9 |
| 5,264,804 | 11/1993 | Fox | 330/9 X |
| 5,471,654 | 11/1995 | Okazaki et al. | 455/234.1 X |

Primary Examiner—Wellington Chin
Assistant Examiner—Philip J. Sobutka
Attorney, Agent, or Firm—Foley & Lardner

[57] ABSTRACT

A variable-gain amplifier circuit has an offset correcting function by which the fluctuation of offset due to the switching of a gain is decreased. In an offset detection mode, an input offset voltage of the variable-gain amplifier circuit is inputted to an offset retaining section, and in a signal amplifying mode, the offset is corrected by subtracting the output of the offset retaining section from an input signal by means of an input section of the variable-gain amplifier circuit. In addition, the variable-gain amplifier circuit can be applied to a radio receiver. The offset produced in a baseband section of a receiver is corrected by the offset correcting function of the variable-gain amplifier circuit, so as to prevent the quality of communication from being deteriorated.

10 Claims, 20 Drawing Sheets

VARIABLE-GAIN AMPLIFIER CIRCUIT, OFFSET CONTROL METHOD IN VARIABLE-GAIN AMPLIFIER CIRCUIT, RADIO RECEIVER WITH VARIABLE-GAIN AMPLIFIER CIRCUIT, AND RADIO RECEIVING METHOD IN RADIO RECEIVER WITH VARIABLE-GAIN AMPLIFIER

BACKGROUND OF THE INVENTION

The present invention relates to a variable-gain amplifier circuit, an offset control method in a variable-gain amplifier circuit, a radio receiver with a variable-gain amplifier circuit, and a radio receiving method in a radio receiver with a variable-gain amplifier. More specifically, the invention relates to a variable-gain amplifier circuit having a DC offset correcting function, a method for correcting a DC offset component in this circuit, a radio receiver with a variable-gain amplifier circuit having a DC offset correcting function, and a radio receiving method for receiving a radio frequency signal while correcting a DC offset component in this receiver.

As a conventional variable-gain amplifier circuit, for example, a circuit as shown in FIG. 1 is known. In this figure, a variable-gain amplifier circuit comprises: an operation amplifier circuit 1 for receiving an input signal, for example, a radio or intermediate frequency signal, as a phase input to output an amplified signal; a variable attenuation circuit 2 for setting a desired quantity of variable attenuation corresponding to a gain of the output of the operation amplifier circuit 1 to supply the set quantity of variable attenuation to an anti-phase input; an input terminal 6 for receiving the input signal; and an output terminal 7 for outgoing the amplified output.

In this variable-gain amplifier circuit, assuming that the gain of the operation amplifier circuit 1 is g and the transmittance of the variable attenuation circuit is f, the transmittance A of the whole circuit can be expressed by the following formula (1).

$$A = g/(1+gf) \qquad \ldots (1)$$

Assuming that the value gf is sufficiently larger than 1, the formula (1) can be approximated to A=1/f. In the circuit of FIG. 1, it is possible to control the value f and to allow the gain A which is the reciprocal number thereof, to be variable. As an embodied construction of the variable attenuation circuit, the circuits of FIGS. 12 and 13 which will be described later are known. That is, in accordance with a potential difference between the terminal of the variable attenuation circuit 2 on the side of the output terminal 7 and the terminal of the operation amplifier circuit 1 on the negative phase input side, a certain rate of electric potential occurs between the terminals. By selecting this rate by means of switches, the circuit functions as a variable attenuation circuit.

In such a variable attenuation circuit, there is a problem in that the offset of the operation amplifier circuit 1 appears in the output. In addition, the offset fluctuates in accordance with the switching of the gain. For example, when the input offset voltage of the operation amplifier circuit 1 is 2mV and the voltage gain of the variable-gain amplifier circuit is 10, a DC offset voltage of 20mV appears in the output. When the voltage gain is 100, the DC offset voltage is 200mV. In recent communication appliances, there is a tendency to set a lower supply voltage in order to decrease consumed power. For example, assuming that the supply voltage is 3 V, an offset voltage of 200 mV can not be disregarded.

In addition, the following conventional radio receiver is known. The receiver controls signal levels in first and second intermediate-frequency amplifier circuits. In this case, since the signal frequency is apart from direct current even if the DC offset fluctuates, a desired signal can be easily separated from the offset by means of a capacity coupling circuit or the like. However, there are many parts which are difficult to be integrated as a semiconductor integrated circuit such as an intermediate-frequency band-pass filter (BPF), so that the aforementioned receiver is not suitable for a small receiver.

In addition, a receiver of a direct conversion system for directly converting a high frequency signal to a baseband signal without passing through an intermediate frequency signal has been proposed. This system is suitable for a small receiver since the number of parts which are difficult to be integrated is less than the of the aforementioned receiver. However, since there is no intermediate frequency, the baseband section must have a great gain, so that the offset is amplified. In addition, since the gain must be controlled by the baseband in order to obtain a signal of a suitable level, the magnitude of offset fluctuates. Since the baseband signal contains a signal component of direct or nearly direct current, the DC offset and its fluctuation are the same as those of a jamming wave overlapping with a desired signal in a digital signal processing section, so that the quality of communication may be deteriorated.

SUMMARY OF THE INVENTION

It is therefore an object of the present invention to eliminate the aforementioned problems and to provide a variable-gain amplifier circuit which can switch the mode thereof between an offset detection mode and a signal amplifying mode, so as to have a suitable offset correcting function by supplying a signal obtained by subtracting an output corresponding to a DC offset detected and retained in the offset detection mode, to signal amplifying means in the signal amplifying mode, and a ratio receiver which can correct an offset to receive a radio signal using the variable-gain amplifier circuit.

In order to accomplish the aforementioned and other objects, according to one aspect of the present invention, a variable-gain amplifier circuit comprises: signal amplifying means for amplifying an input signal; gain control means for controlling a gain of the signal amplifying means; mode selection means for selecting any one of a signal amplifying mode in which the input signal is amplified by a predetermined gain, and an offset detection mode in which an offset of the signal amplifying means is detected; offset retaining means for retaining the offset detected by the signal amplifying means; and mode switching means for allowing an input offset of the signal amplifying means to be inputted to the offset retaining means in the offset detection mode, and for allowing a signal derived by subtracting an output of the offset retaining means to be inputted to the signal amplifying means in the signal amplifying mode, so as to produce a control signal for correcting the offset.

According to another aspect of the present invention, an offset control method in the variable-gain amplifier circuit having the aforementioned construction, comprises the steps of: controlling a gain of the gain control means so that the detection sensitivity of the quantity of offset of the signal amplifying means is optimum after a power supply is turned on and in the case of the offset detection mode; detecting the quantity of offset of the signal amplifying means while being controlled so that the detection sensitivity of the quantity of offset is optimum, and retaining the quantity of offset by the offset retaining means; controlling the gain of the gain control means in accordance with the amplitude of an input signal after the offset detection mode is switched to the signal amplifying mode by the mode selection means; and amplifying and outputting the input signal in accordance with the controlled gain by the signal amplifying means.

According to further aspect of the present invention, a radio receiver with a variable-gain amplifier circuit, comprises: a radio frequency amplifier circuit for amplifying an input radio frequency signal; a signal supply selecting circuit for determining whether the input signal is supplied; a frequency mixer circuit for mixing frequencies of the signal; and a variable-gain amplifier circuit having the aforementioned construction, wherein a signal interrupting circuit interrupts the input signal inputted to the frequency mixer circuit in the offset detection mode, and the offset retaining means retains a DC offset produced in a signal line extending from the frequency mixer circuit, in which the signal input is interrupted, to the variable-gain amplifier circuit.

According to still further aspect of the present invention, a radio receiving method in the radio receiver having the aforementioned construction, comprises the steps of: selecting the offset detection mode by the mode selection means when the radio receiver does not carry out communication, and retaining a DC offset produced in the signal line by the offset retaining means; and selecting the amplifying mode by the mode selection means when the radio receiver carries out communication, and outputting an offset-corrected and amplified signal by the signal amplifying means.

In a case where the aforementioned radio receiver is applied to a time-division multiplex access (TDMA) system, it is not always required to amplify all of the frequency components of the signal when the presence of a received signal is determined before the communication is commenced. Therefore, an amplifier circuit having a band-pass characteristic for amplifying a part of the frequency components is used to wait for a signal to detect the signal, and then, an offset-corrected variable-gain amplifier circuit is used to prevent an offset retaining capacity from being discharged due to the signal waiting for a long period of time.

In addition, if a frequency mixer circuit equipped with a variable-gain amplifier circuit of the present invention and signal supply selecting means are used for the radio receiver, it is possible to correct a DC offset produced in the signal line extending from the frequency converting circuit of the radio receiver to the variable-gain amplifier circuit thereof.

DESCRIPTION OF THE PREFERRED EMBODIMENT

Figure 1:
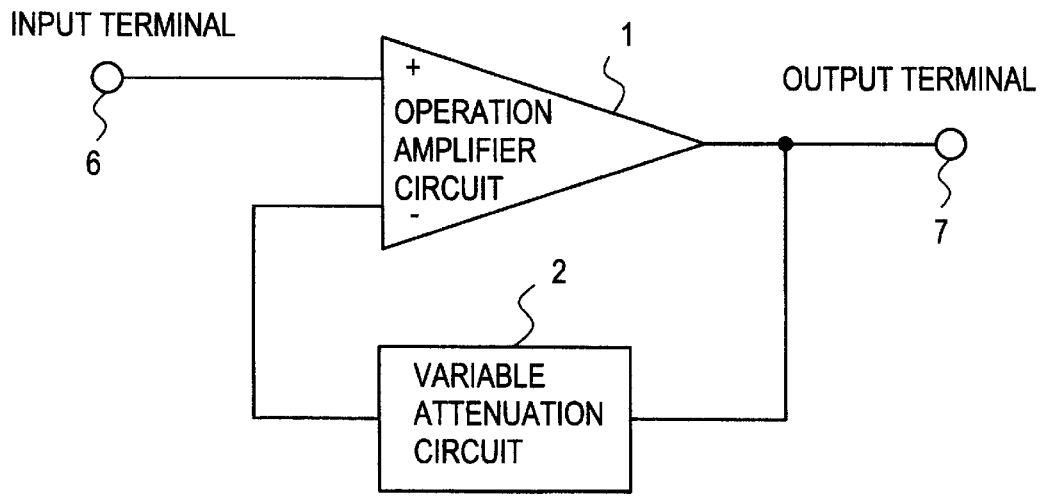
FIG. 1 is a block diagram of a conventional variable-gain amplifier circuit.
Figure 2:
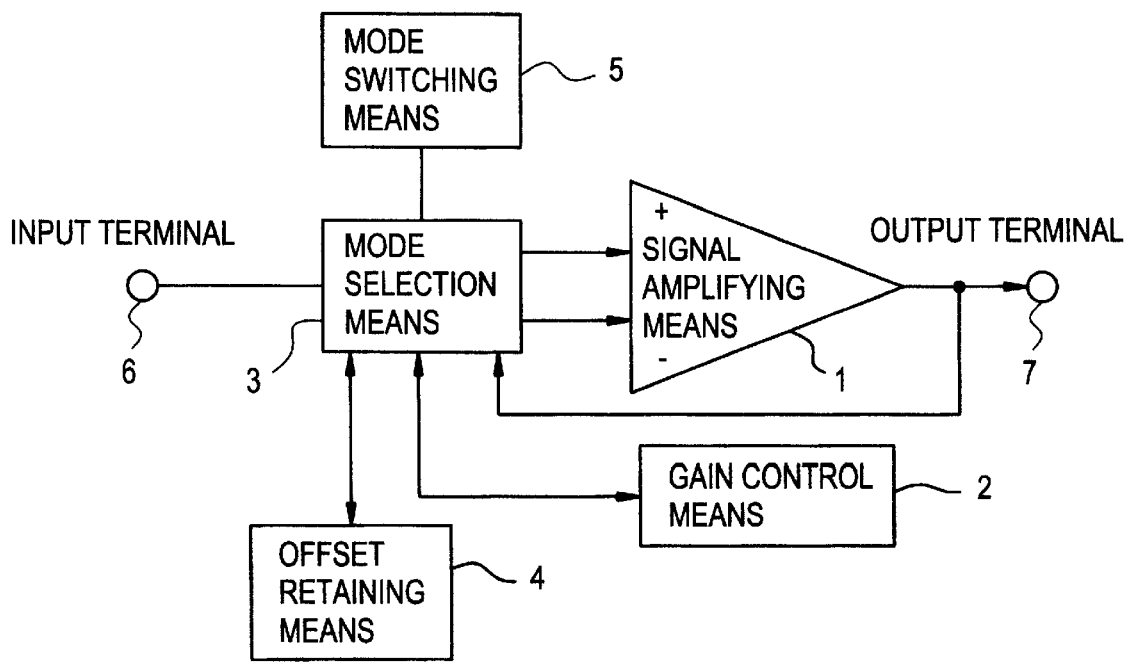
FIG. 2 is a block diagram illustrating a basic concept of a variable-gain amplifier circuit according to the present invention.

Referring now to the drawings, particularly to FIG. 2, a basic concept of the present invention will be described below. Furthermore, the preferred embodiments of a variable-gain amplifier circuit and a radio receiver using this circuit, according to the present invention, will be described later.

In FIG. 2, a variable-gain amplifier circuit comprises: signal amplifying means 1 for amplifying an input signal; gain control means 2 for controlling a gain of the signal amplifying means 1; mode selection means 3 for selecting a mode between a signal amplifying mode in which the input signal is amplified by a given gain and an offset detection mode in which an offset of the signal amplifying means 1 is detected; offset retaining means 4 for retaining the detected offset of the signal amplifying means 1; and mode switching means 5 for causing an input offset of the signal amplifying means 1 to be inputted to the offset retaining means 4 in the offset detection mode, and a signal derived by subtracting an output of the offset retaining means 4 to be inputted to the signal amplifying means 1 in the signal amplifying mode, so as to correct the offset. Furthermore, the reference number 6 denotes an input terminal for inputting an input signal of a ratio or intermediate frequency, and the reference number 7 denotes an output terminal for outputting the signal amplified by the signal amplifying means 1.

Referring to the accompanying drawings, the preferred embodiments of a variable-gain amplifier circuit, according to the present invention, will be described below.

Figure 3:
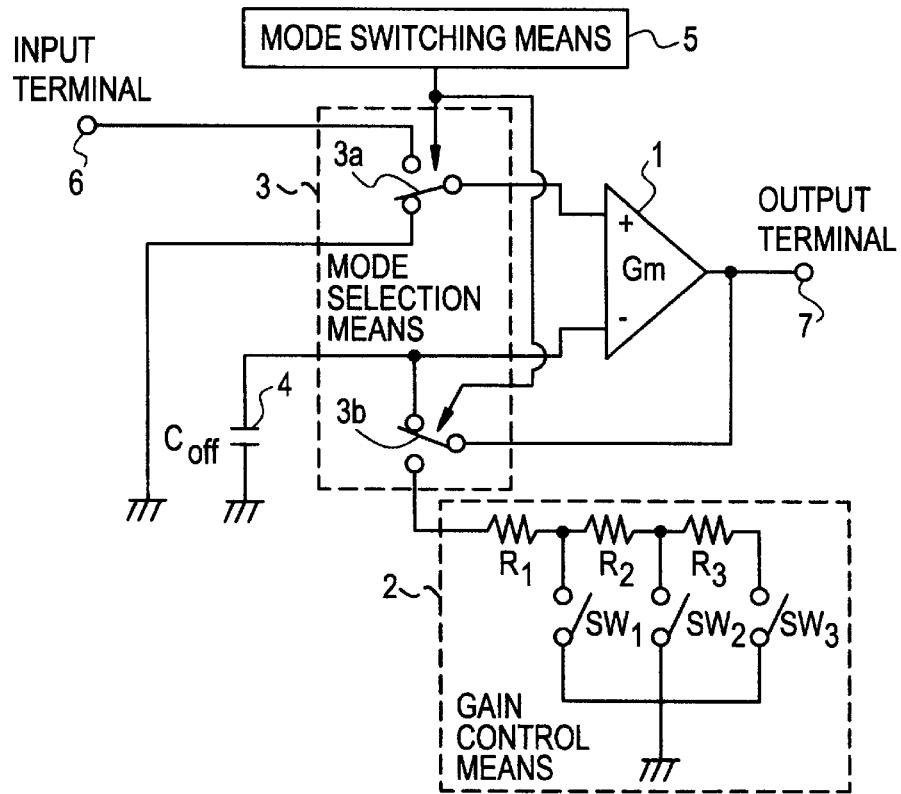
FIG. 3 is a block diagram of the first preferred embodiment of a variable-gain amplifier circuit according to the present invention.

FIG. 3 is a block diagram of the first preferred embodiment of a variable-gain amplifier circuit according to the present invention. In this preferred embodiment, a voltage controlled current source is used as the signal amplifying means. Therefore, the output voltage is a product derived by multiplying a mutual conductance of the voltage controlled current source by an impedance of a load, so as to form a variable-gain amplifier circuit using a variable resistor circuit as the gain control means. In FIG. 3, switches 3a and 3b of the mode switching means 3 are positioned in the offset detection mode. Until the output current of the voltage controlled current source is zero, a current flows into a capacitor $C_{off}$ serving as the offset retaining means 4, so that a voltage corresponding to an input offset voltage is charged in the capacitor $C_{off}$. When the switches 3a and 3b are switched, the offset detection mode is switched to the signal amplifying mode. As shown in FIG. 3, the gain control means 2 comprises resistors R1, R2 and R3 connected to each other in series, and switches SW1, SW2 and SW3 connected to these resistors in parallel.

Furthermore, while the capacitor $C_{off}$ is used as the offset retaining means in the first preferred embodiment, an A/D converter and a D/A converter may be used to retain the offset voltage as digital data.

Figure 4:
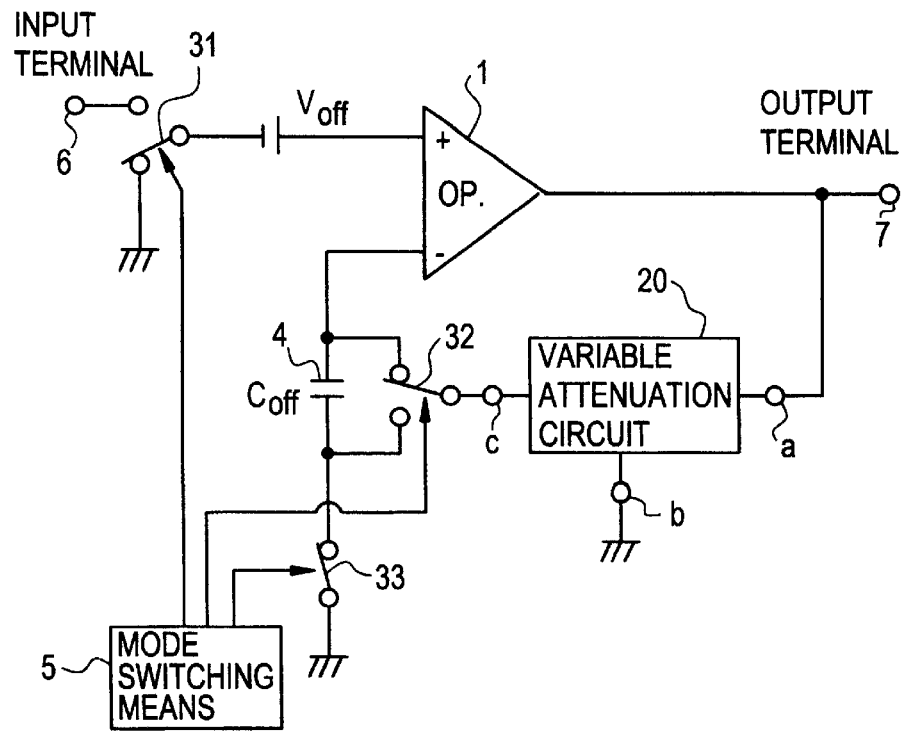
FIG. 4 is a block diagram of the second preferred embodiment of a variable-gain amplifier circuit according to the present invention.
Figure 5:
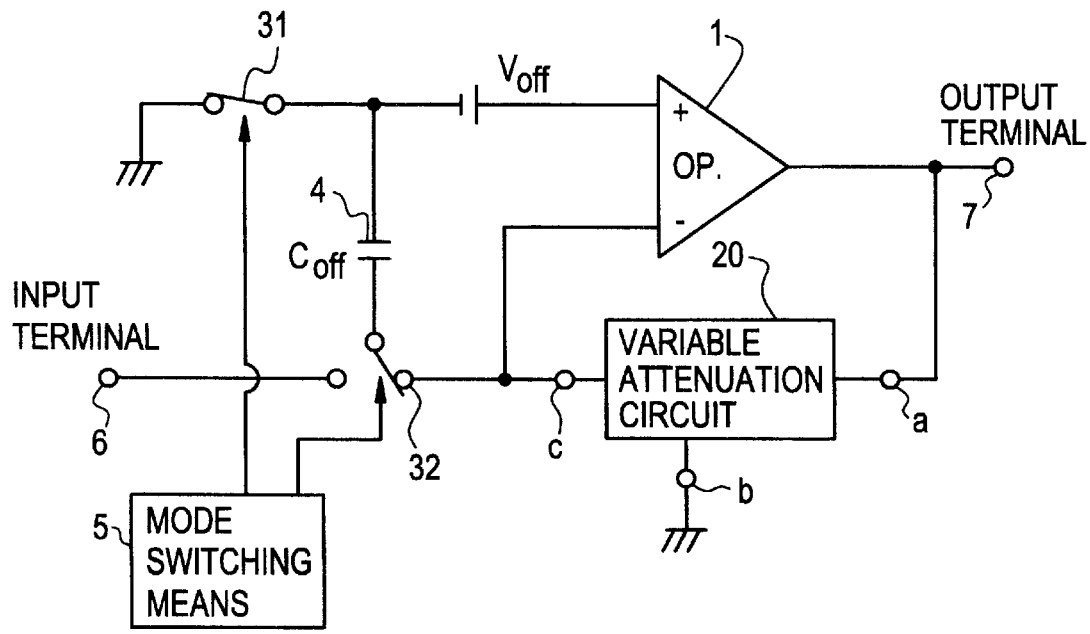
FIG. 5 is a block diagram of the third preferred embodiment of a variable-gain amplifier circuit according to the present invention.
Figure 6:
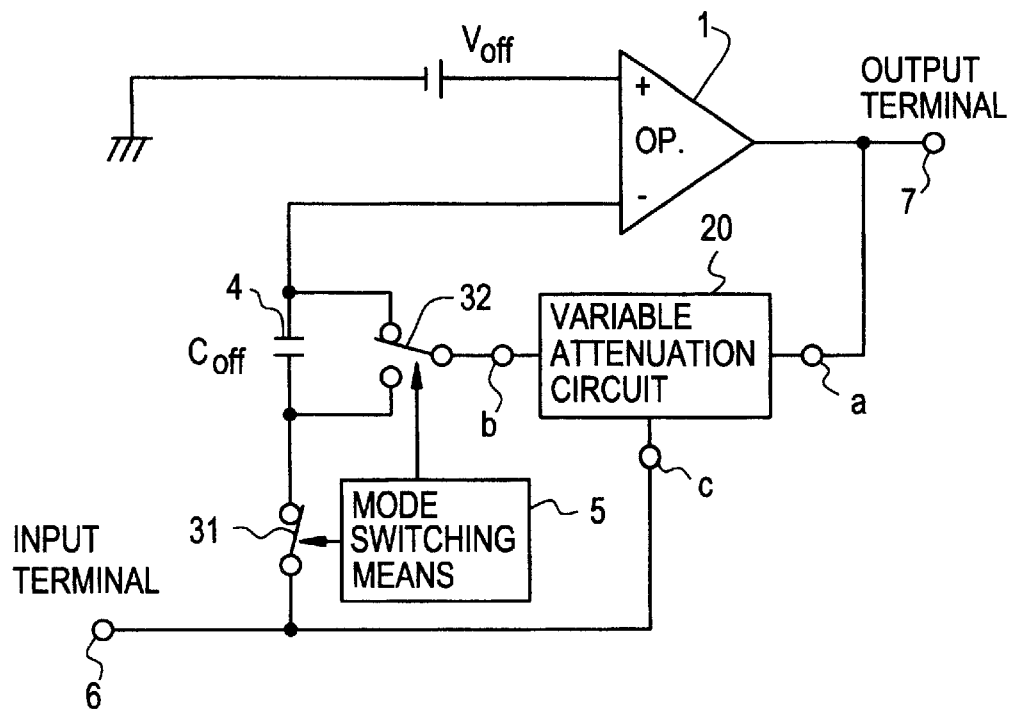
FIG. 6 is a block diagram of the fourth preferred embodiment of a variable-gain amplifier circuit according to the present invention.
Figure 7:
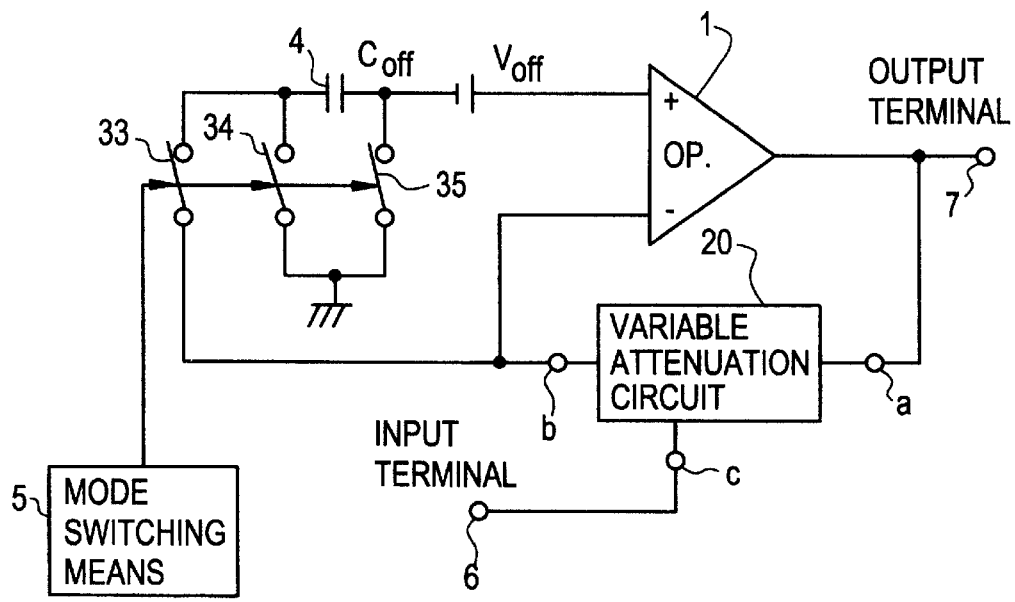
FIG. 7 is a block diagrams of the fifth preferred embodiment of a variable-gain amplifier circuit according to the present invention.

FIGS. 4 through 7 are block diagrams of the second through fifth preferred embodiments of a variable-gain amplifier circuit according to the present invention. In these preferred embodiments, there is a common feature in that an operation amplifier circuit is used as the signal amplifying circuit 1. In the second and third preferred embodiments as shown in FIGS. 4 and 5 respectively, a non-inverting amplifier circuit is used as the signal amplifying means 1, and in the fourth and fifth preferred embodiments as shown in FIGS. 6 and 7 respectively, an inverting amplifier circuit is used as the signal amplifying means 1. In addition, FIGS. 4 and 6 shows examples in which an offset capacity 4 is inserted into a negative input terminal of the operation amplifier circuit 1, and FIGS. 5 and 7 shows examples in which the offset capacity 4 is inserted into a positive input terminal of the operation amplifier circuit 1.

In FIGS. 4 through 7, the traveling contacts of switches 31 and 32 serving as the mode selection means 3 are positioned so as to select the offset detection mode. In order to facilitate explanation, an input offset voltage of the operation amplifier circuit 1 is expressed by $V_{off}$ in the drawings. If a feedback is applied to the negative terminal of the operation amplifier circuit 1, the operation amplifier circuit 1 outputs a voltage so as to decrease the potential difference between two input terminals. As a result, the input offset voltage $V_{off}$ is applied to the offset retaining capacity $C_{off}$. In this case, if the quantity of attenuation of a variable attenuation circuit 20 serving as the gain control circuit 2 is decreased as small as possible, it is possible to decrease the quantity of error in voltage charged in the retaining capacity $C_{off}$ serving as the offset retaining means 4. When the switches 31 and 32 are inverted from this state, a feedback signal being the output of the variable attenuation circuit 20 is inputted to the operation amplifier circuit 1 via the offset retaining capacity 4 since the offset retaining capacity 4 is connected to the negative input terminal of the operation amplifier circuit 1. As a result, in the variable-gain amplifier circuits of FIGS. 4 and 6, a signal shifted by an input offset voltage is inputted to the negative input terminal, and a voltage shifted by $V_{off}$ from an input signal or a reference potential is inputted to the positive input terminal, so that a DC offset of the output of the operation amplifier circuit 1 is canceled. In addition, in the variable-gain amplifier circuits of FIGS. 5 and 7, the offset voltage is removed by the retaining capacity since the retaining capacity $C_{off}$ is connected to the input offset voltage $V_{off}$ in series.

Furthermore, the embodied constructions of the variable attenuation circuit 20 will be described later referring to FIGS. 10 though 13. In order to facilitate the explanation of the embodied constructions thereof, it is assumed that the terminal on the side of the output terminal 7 is expressed by a, the terminal on the side of the ground is expressed by b, and the terminal on the side of the negative input terminal of the operation amplifier circuit 1 is expressed by c.

Figure 8:
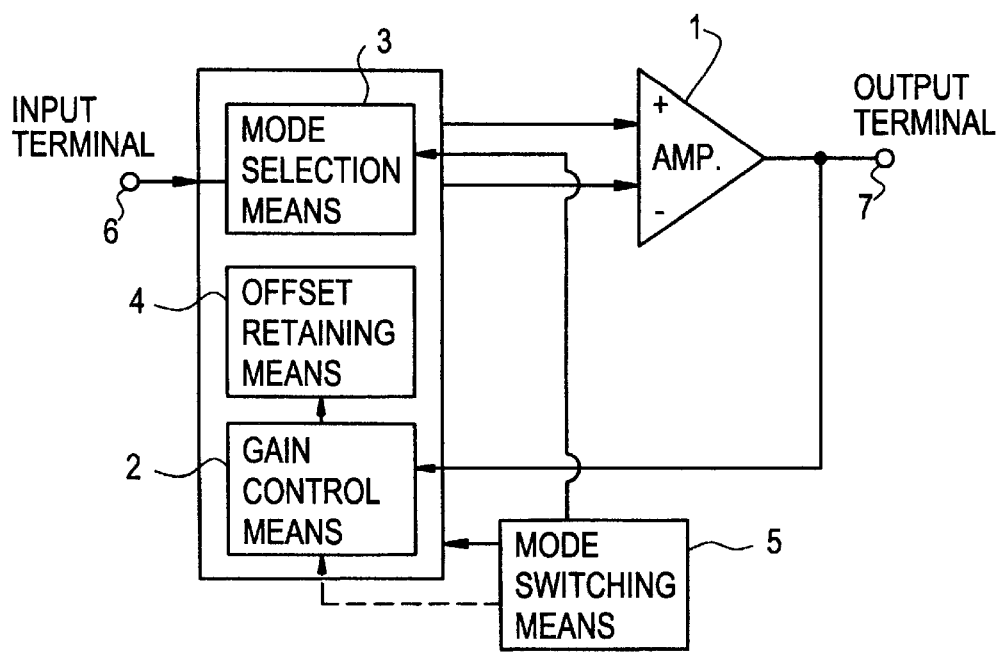
FIG. 8 is a block diagram illustrating another basic concept of a variable-gain amplifier circuit according to the present invention.
Figure 9:
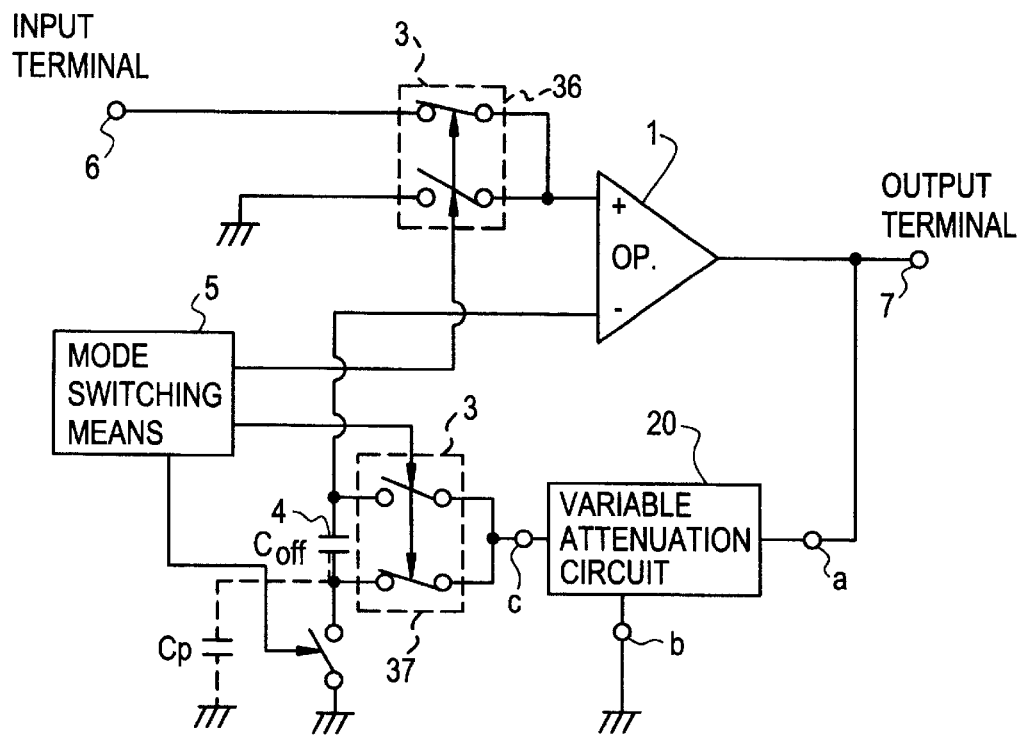
FIG. 9 is a block diagram of the sixth preferred embodiment of a variable-gain amplifier circuit according to the present invention.

FIG. 8 is a block diagram illustrating another basic concept of a variable-gain amplifier circuit according to the present invention, which is an overall conceptual diagram containing the preferred embodiments of FIGS. 4 through 7 using the operation amplifier circuit 1 and the sixth preferred embodiment of FIG. 9. In FIG. 8, the output of the operation amplifier circuit 1 is returned to the gain control means 2 as a feedback.

Figure 10:
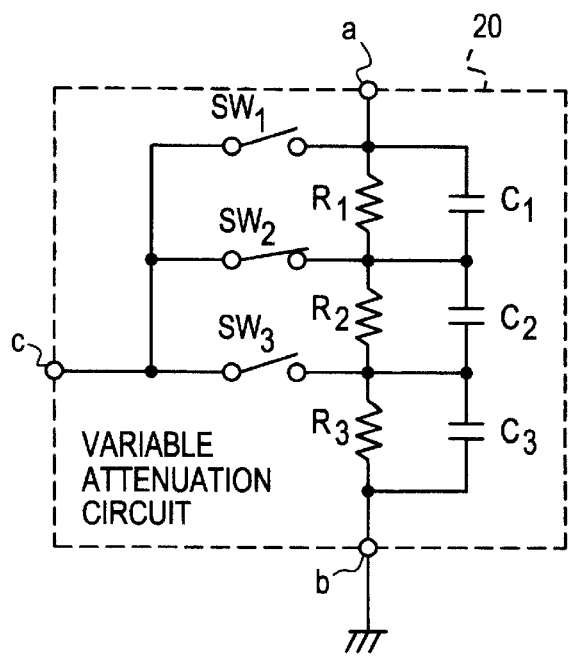
FIG. 10 is a circuit diagram of the first embodiment of a variable attenuation circuit applied to the sixth preferred embodiment of a variable-gain amplifier circuit according to the present invention.

FIG. 9 is a block diagram of the sixth preferred embodiment of a variable-gain amplifier circuit according to the present invention, and FIG. 10 is a circuit diagram illustrating an embodiment of the variable attenuation circuit 20 of FIG. 10. In FIG. 9, switches 36 and 37 serving as the mode selection means 3 are positioned in the gain amplifying mode. At the electrode of the retaining capacity $C_{off}$ of the offset retaining means 4, a parasitic capacity Cp is connected, in parallel, to a series circuit of the resistors R2 and R3 in the variable attenuation circuit 20 of FIG. 10, so that a current flows through the parasitic capacity as the frequency increases. For that reason, when a variable attenuation circuit consisting of resistors is used as shown in FIGS.

Figure 11:
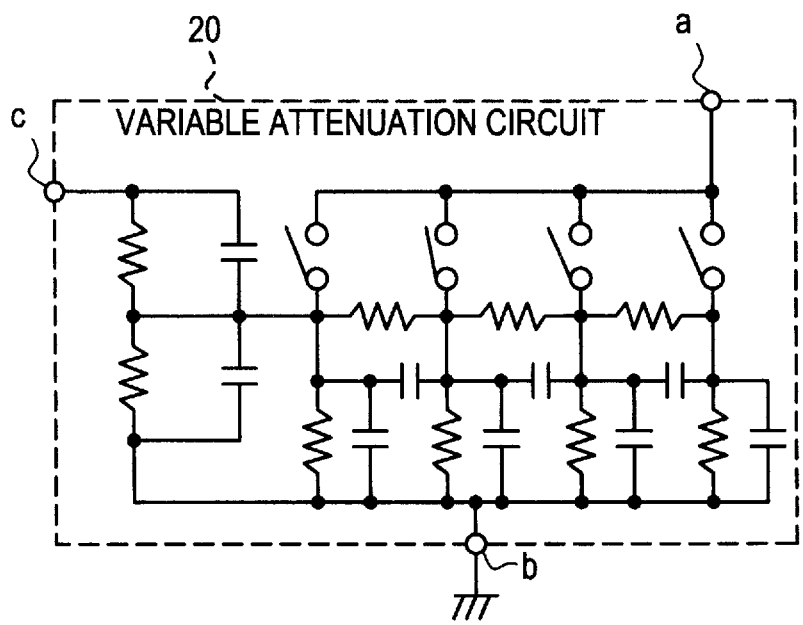
FIG. 11 is a circuit diagram of the second embodiment of a variable attenuation circuit applied to a variable-gain amplifier circuit according to the present invention.

12 and 13, the phase is rotated at a high frequency so as to be shifted from the gain determined by the values of the resistors. This may cause oscillation due to some frequency characteristics of the operation amplifier circuit. As shown in FIGS. 10 and 11, it is possible to restrain the quantity of attenuation and the fluctuation of phase by connecting the resistor circuit to the capacity circuit in parallel. In this case, if the ratio of the resistances is equal to the ratio of the reciprocal numbers of the capacities, it is possible to obtain a flat frequency characteristic. Since it is difficult to accurately estimate the value of the parasitic capacity Cp, it is difficult to obtain a flat frequency characteristic. However, since the quantity of attenuation and the fluctuation of phase can be decreased by adding a capacitive element to the variable attenuation circuit, it is possible to prevent the circuit from being unstable to oscillate.

FIG. 11 is a circuit diagram of another embodiment of the variable attenuation circuit 20 for decreasing the influence by the parasitic capacity. The circuit of FIG. 11 is preferred when a large quantity of attenuation is obtained, since the circuit of FIG. 11 has a smaller element sensitivity than that of FIG. 10 so as to reduce error.

Figure 12:
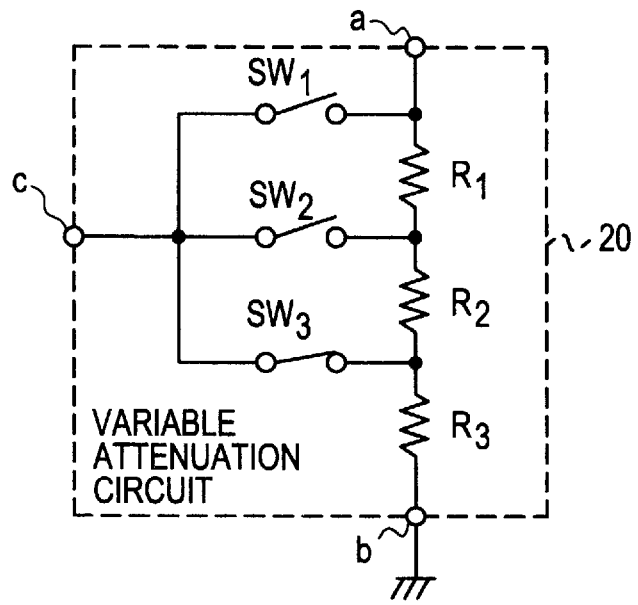
FIG. 12 is a circuit diagram of the third embodiment of a variable attenuation circuit 20 applied to a variable-gain amplifier circuit according to the present invention.
Figure 13:
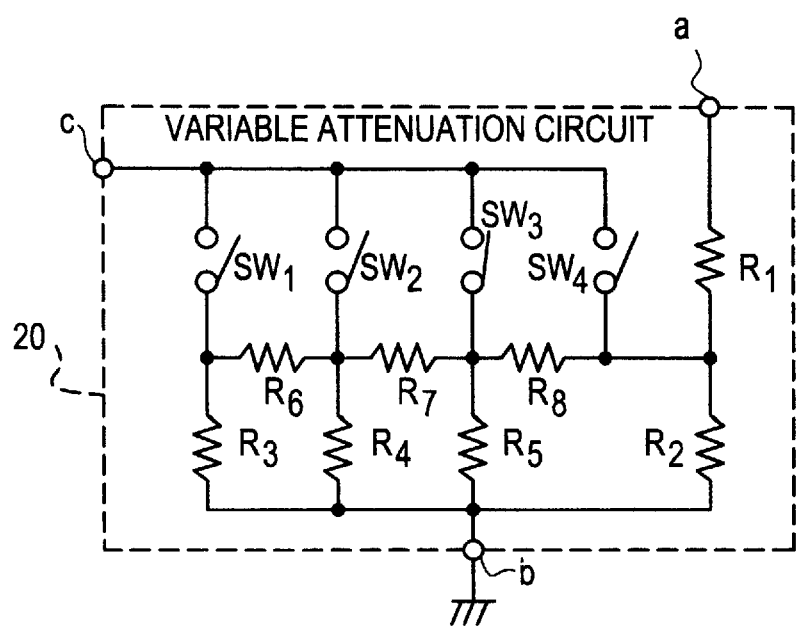
FIG. 13 is a circuit diagram of the fourth embodiment of a variable attenuation circuit 20 applied to a variable-gain amplifier circuit according to the present invention.

FIGS. 12 and 13 are circuit diagrams of further embodiments of the variable attenuation circuit 20 of FIG. 9. FIG. 12 illustrates a circuit which comprises resistors R1, R2 and R3 connected to each other in series between the terminals a and b, a switch SW1 provided between the connecting point of the terminal a to resistor R1 and the terminal c, a switch SW2 connected to the switch SW1 in parallel and provided between the connecting point of the resisters R1 and R2 and the terminal c, and a switch SW3 connected to the switch SW1 in parallel and provided between the connecting point0 of the resisters R2 and R3 and the terminal c. In addition, FIG. 13 illustrates a circuit which comprises resisters R1 and R2 connected to each other in series between the terminals a and b, a switch SW1 and a resister R3 which are connected to each other in series between the terminals a and c, a switch SW2 and a resistor R4 which are connected to each other in series so as to be connected to the series element of the switch SW1 and the resister R3 in parallel, a switch SW3 and a resistor R5 which are connected to each other in series so as to be connected to the series element of the switch SW1 and the resistor R3 in parallel, a switch SW4 connected to the switch SW3 in parallel, and resistors R6, R7 and R8 which are connected to the connecting points of the respective series elements in parallel.

With the aforementioned constructions, a predetermined rate of potential in the potential difference between the terminals a and c of FIGS. 12 and 13 is produced between the terminals b and c. This rate is selected by the opening and closing of the plurality of switches so as to form a variable attenuation circuit.

Referring to a flowchart of FIG. 14, as the seventh preferred embodiment of the present invention, an offset control method in the variable-gain amplifier circuits having the aforementioned constructions will be described below. This offset control method may be applied to any one of the first through sixth preferred embodiments of a variable-gain amplifier circuit according to the present invention.

Figure 14:
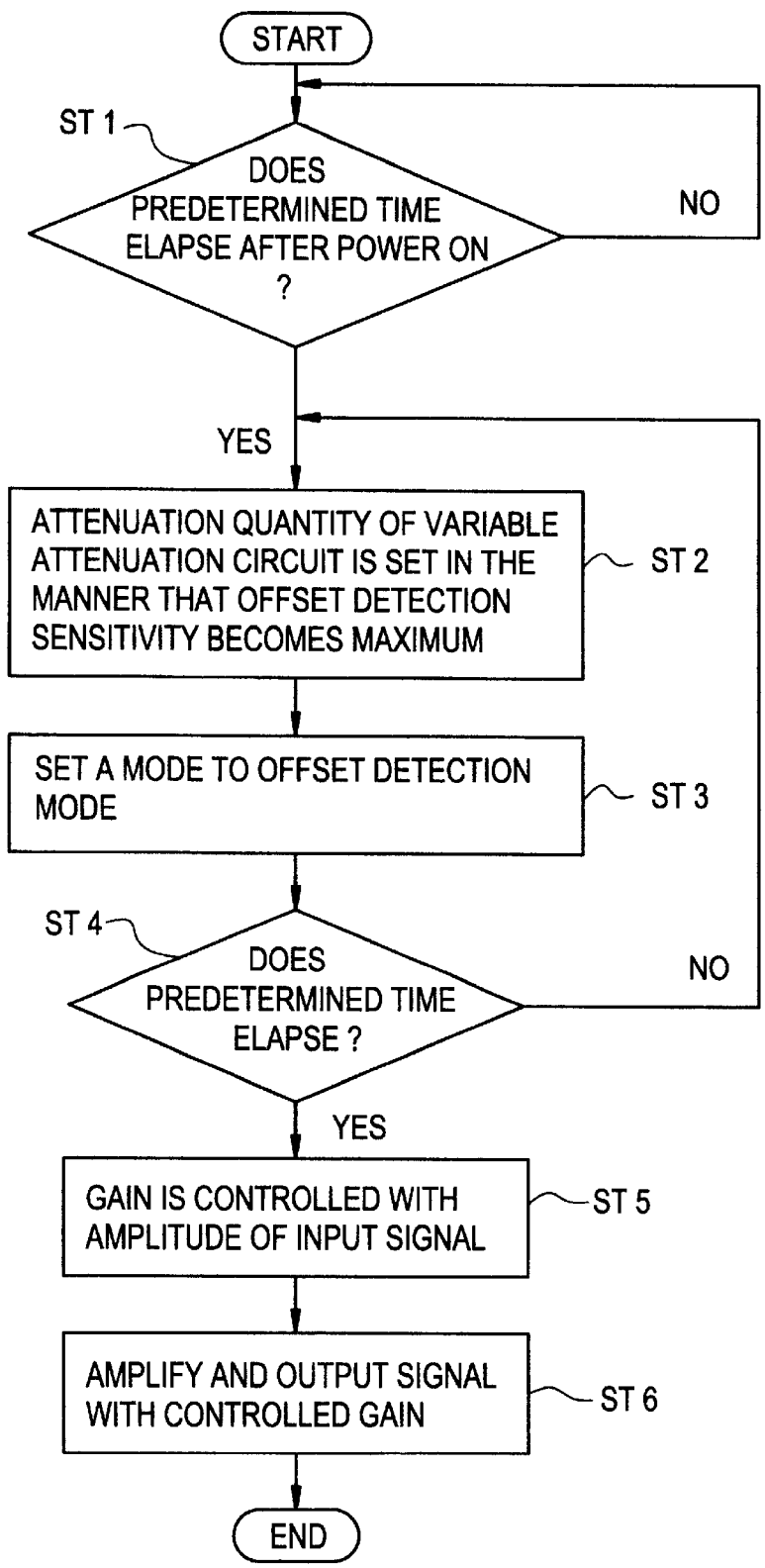
FIG. 14 is a flowchart showing an offset control method in the seventh preferred embodiment of a variable-gain amplifier circuit according to the present invention.

In FIG. 14, it is determined at step ST1 whether or not a predetermined time elapses after power supply is turned on. When it is determined at step ST1 that the predetermined time elapses, the gain of the signal amplifying means is controlled at step ST2 to set the attenuation quantity of variable attenuation circuit in the manner that offset detection sensitivity becomes maximum. At step ST3, the mode is set to the offset detection mode.

Then, it is determined at step ST4 whether or not the predetermined time elapses. When it is determined that the predetermined time does not elapse, steps ST2 and ST3 are repeated. On the other hand, when it is determined that the predetermined time elapses, the gain is controlled in accordance with the amplitude of the input signal at the next step ST5. At step ST6, the input signal is amplified in accordance with the controlled gain to be supplied to a downstream circuit, for example, to an analog/digital (A/D) converter or the like.

Then, referring to FIGS. 15 through 27, the preferred embodiments of a radio receiver according to the present invention, which is equipped with the variable-gain amplifier circuit having the aforementioned construction and being operated in accordance with the aforementioned steps, will be described in detail.

Figure 15:
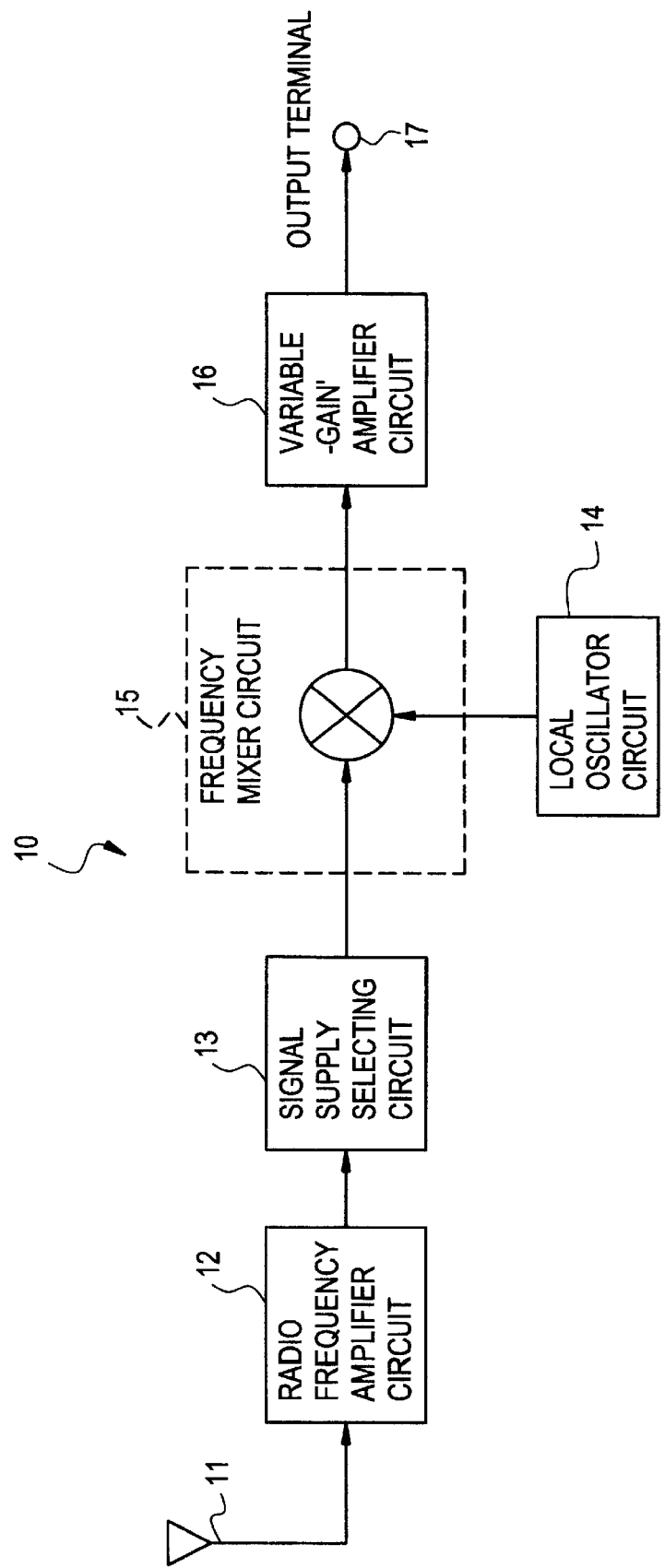
FIG. 15 is a block diagram illustrating a basic concept of a radio receiver with a variable-gain amplifier circuit according to the present invention.

FIG. 15 is a block diagram illustrating a basic concept of a radio receiver with a variable-gain amplifier circuit according to the present invention. In FIG. 15, a radio receiver 10 comprises a radio frequency amplifier circuit 12 for amplifying a radio frequency signal by means of an antenna 11, a signal supply selecting circuit 13 for determining whether an input signal is supplied, a frequency mixer circuit 15 for mixing a local signal supplied from a local signal oscillator circuit 14 with an input signal supplied through the signal supply selecting circuit 13, a variable-gain amplifier circuit 16 having any one of the constructions of FIGS. 2 through 13 as set forth above, and an output terminal 17 for outgoing an output of the radio receiver 10.

As one embodiment of a radio receiver with a variable-gain amplifier circuit according to the present invention, there is a receiver using a direct conversion receiving system.

The operation of a receiver using this direct conversion receiving system will be described below. In this receiver, on the basis of a local transmitted signal having a frequency which is substantially equal to the frequency of a radio frequency signal received via the antenna section, a base band signal derived by carrying out the frequency conversion of the received signal is demodulated to output received data.

Specifically, after a high frequency signal received by the antenna section is amplified by means of a high-frequency signal processing section to remove an unnecessary frequency component by means of a high-frequency filter, it is divided into two channels. In a frequency converting section, the frequency conversion is carried out by means of a reference signal having a frequency which is substantially the same as that of the high frequency signal received from the local transmitter. In particular, in the case of orthogonal demodulation, two systems of frequency converting section and signal processing section for I channel and Q channel are prepared, so that the frequency conversion is carried out in each of the frequency converting sections for the respective channels, by means of first and second reference signals S1 and S2 which are shifted by $\pi/2$ from the output signal of the local transmitter by means of a $\pi/2$ phase shifter. The frequency-converted base frequency signals are processed in a base frequency signal processing section, respectively. Specifically, it is converted to a digital signal by means of an A/D converting section after unnecessary high-frequency components are removed by means of a low-pass filter. Thereafter, it is digital-demodulated using an orthogonal detection system, such as a delay detection system, in the output section, and then, information signal, such as voice and pictorial information signals, is reproduced.

Figure 16:
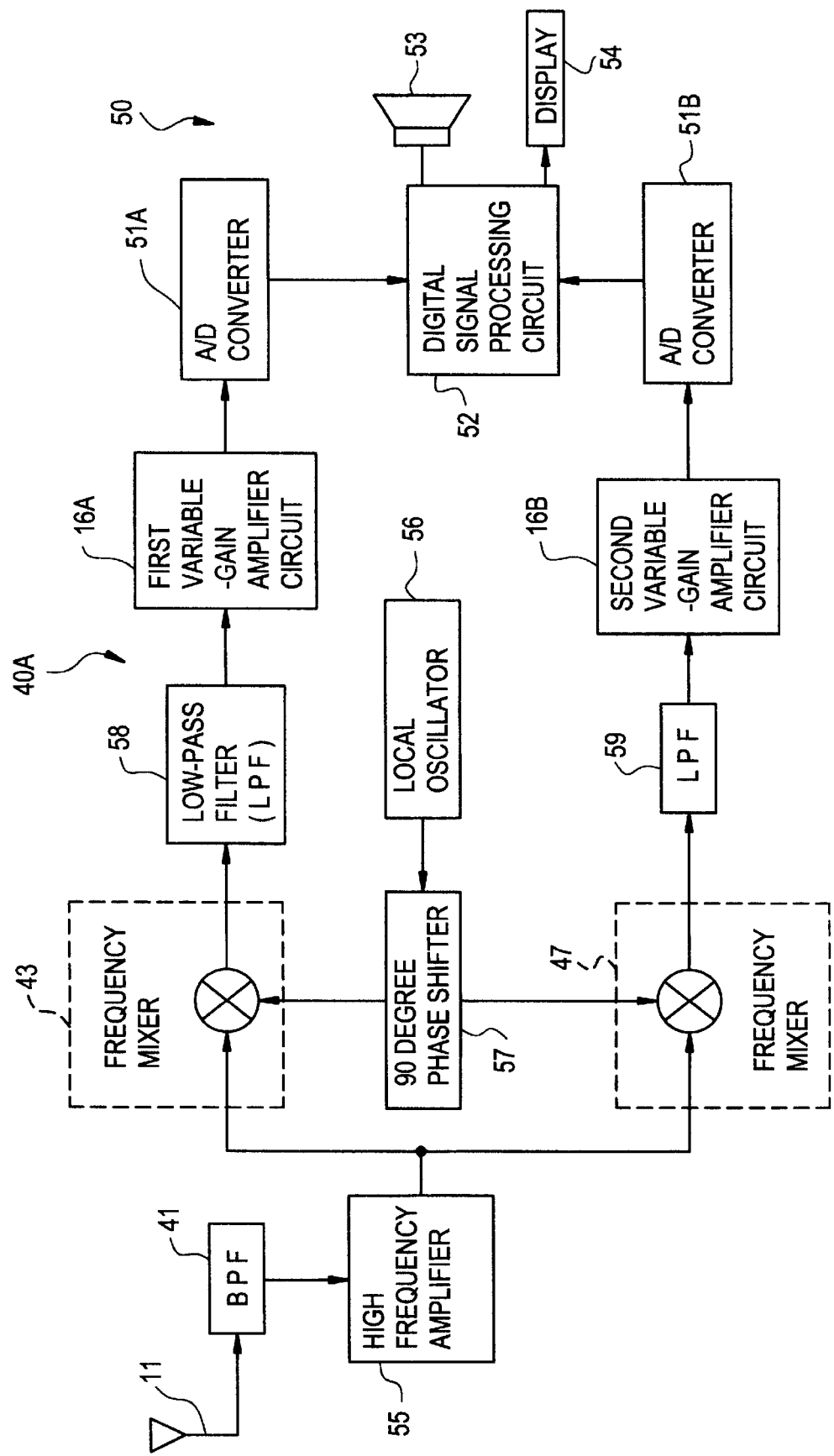
FIG. 16 is a block diagram illustrating the whole construction of the eighth preferred embodiment of a receiver according to the present invention.
Figure 17:
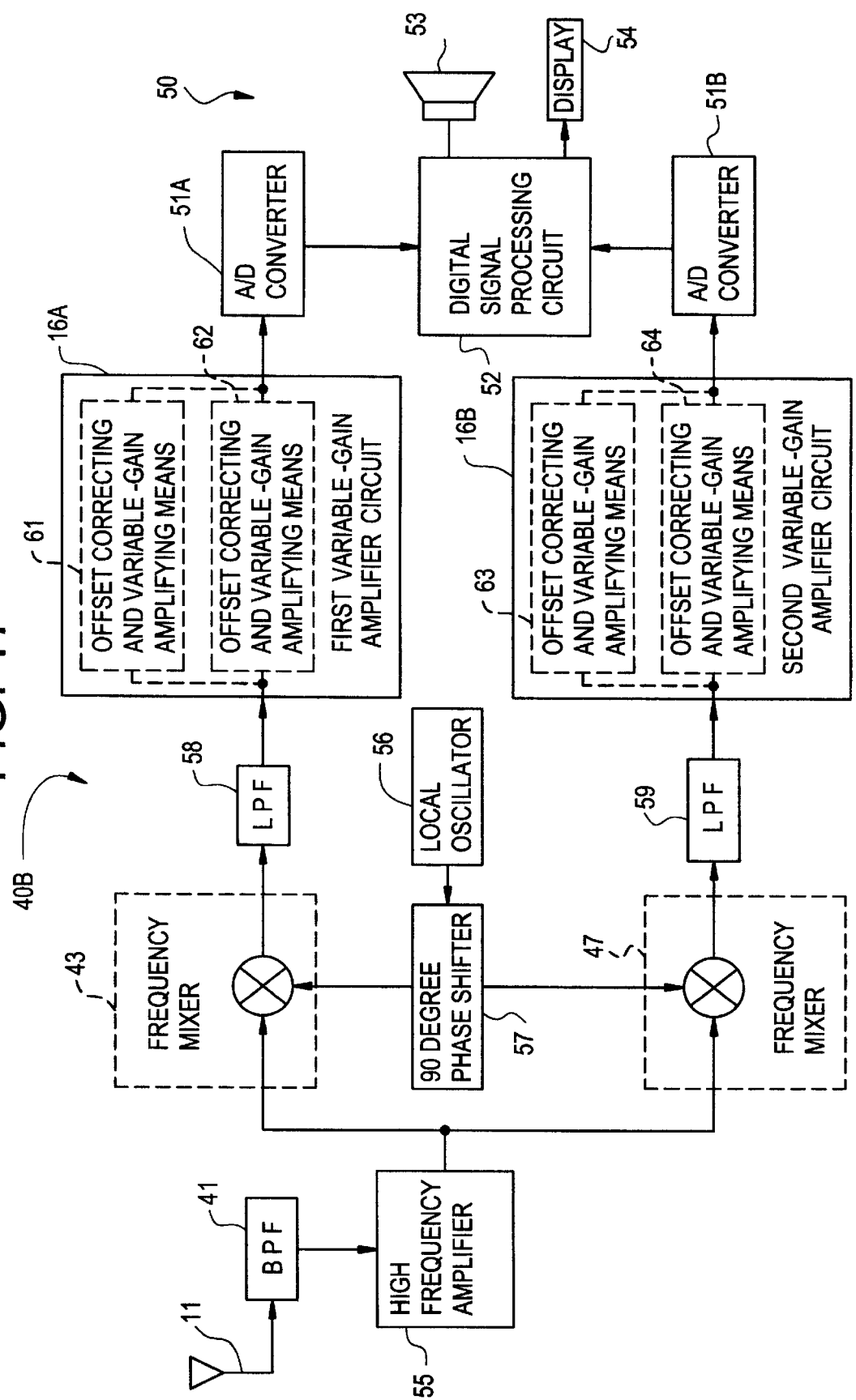
FIG. 17 is a block diagram illustrating the whole construction of the ninth preferred embodiment of a receiver according to the present invention.

Referring to FIGS. 16 and 17, as examples of a direct conversion system, the eighth and ninth preferred embodiments of a radio receiver, according to the present invention, will be described below.

In FIG. 16, a radio receiver 40A in the eight preferred embodiment comprises a BPF 41 for band-pass filtering a radio frequency signal inputted through an antenna 11, a high frequency amplifier 55 for amplifying a high frequency component contained in the output of the BPF 41, a local transmitter 56 for oscillating a local signal, a 90-degree phase shifter 57 for shifting the phase of the local signal by 90 degrees, frequency mixers 43 and 44 for mixing frequencies on the basis of the outputs of the high frequency amplifier 55 and the 90-degree phase shifter 57, low-pass filters (LPF) 58 and 59 for allowing low-frequency components of the outputs of the respective mixers to pass, and first and second variable-gain amplifier circuits 16A and 16B for amplifying the signal output while carrying out the offset correction on the basis of the outputs of LPF 58 and 59. A digital signal processing section 50 is connected to the radio receiver 40A. The digital signal processing section 50 comprises A/D converters 51A and 51B for converting the analog outputs of the amplifier circuits 16A and 16B to digital signals, a digital signal processing circuit 52 for digital-signal processing the outputs of the converters 51A and 51B, a speaker 53 and a display 54.

Figure 18:
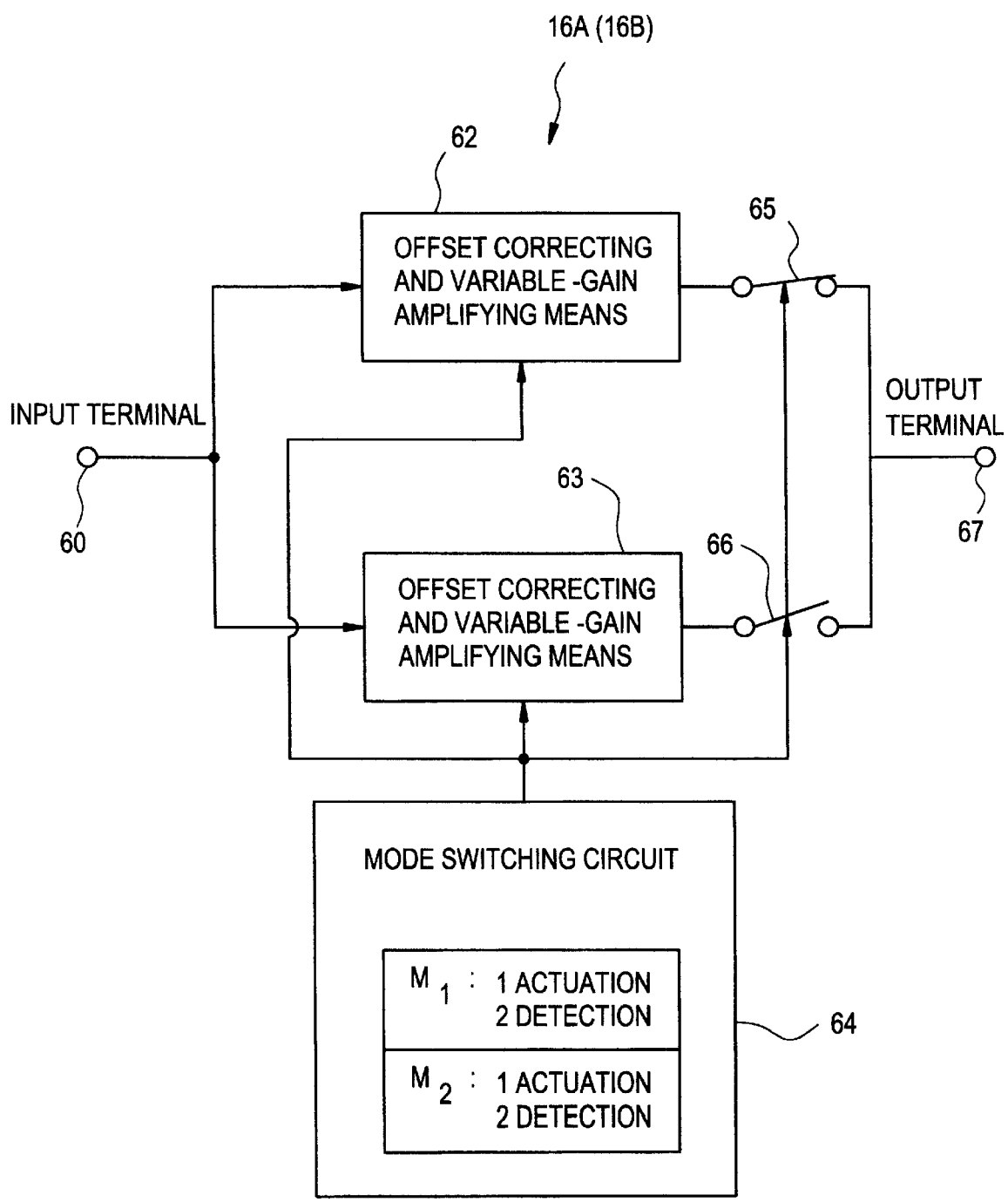
FIG. 18 is a block diagram illustrating the main portion of the tenth preferred embodiment of a radio receiver according to the present invention.

In FIG. 17, a radio receiver 40B in the ninth preferred embodiment is the same as the radio receiver 40A in the eighth preferred embodiment, except that each of first and second variable-gain amplifier circuits 16A and 16B comprises a pair of offset correcting and variable-gain amplifying means 61 and 62 or 63 and 64 which are connected to each other in parallel. FIG. 18 shows this structure in detail.

FIG. 18 illustrates the tenth preferred embodiment of a variable-gain amplifier circuit according to the present invention. When the variable-gain amplifier circuit as shown in any one of FIGS. 6 through 13 is independently used for a receiver, it is possible to receive signals during the offset detection mode. On the other hand, since the offset retaining capacity is gradually discharged due to the leakage current in the switches, it must be recharged after a certain period of time. Therefore, the receiving can be continuously carried out by alternately switching to the gain mode by means of two variable-gain amplifier circuits.

In FIG. 18, a variable-gain amplifier circuit 16A (16B) comprises offset correcting and variable-gain amplifying means 62 and 63 for receiving signals inputted through an input terminal 60, a mode switching control circuit 64 for controlling the switching the mode between the offset detection mode and the signal amplifying mode, switches 65 and 66 for opening a traveling terminal when the offset correcting and variable-gain amplifying means 62 and 63 are in the detection mode and for closing the terminal when they are in the operation mode, and an output terminal 67 for supplying the offset-corrected and amplified outputs of the amplifying means 62 and 63 on the side of the operation mode, to a downstream circuit. The mode switching control circuit 64 carries out the switching operation between a first mode M1 in which the amplifying means 62 and the switch 65 are in the operating state and the amplifying means 63 and the switch 66 are in the detecting state, and a second mode M2 in which they are in the opposite operating state. Therefore, FIG. 18 shows the first mode M1 wherein the signal line extending between the offset correcting and variable-gain amplifying means 62 and the switch 65 is turned on and wherein the amplifying means 63 and the switch 66 are in the offset detection mode.

Figure 19:
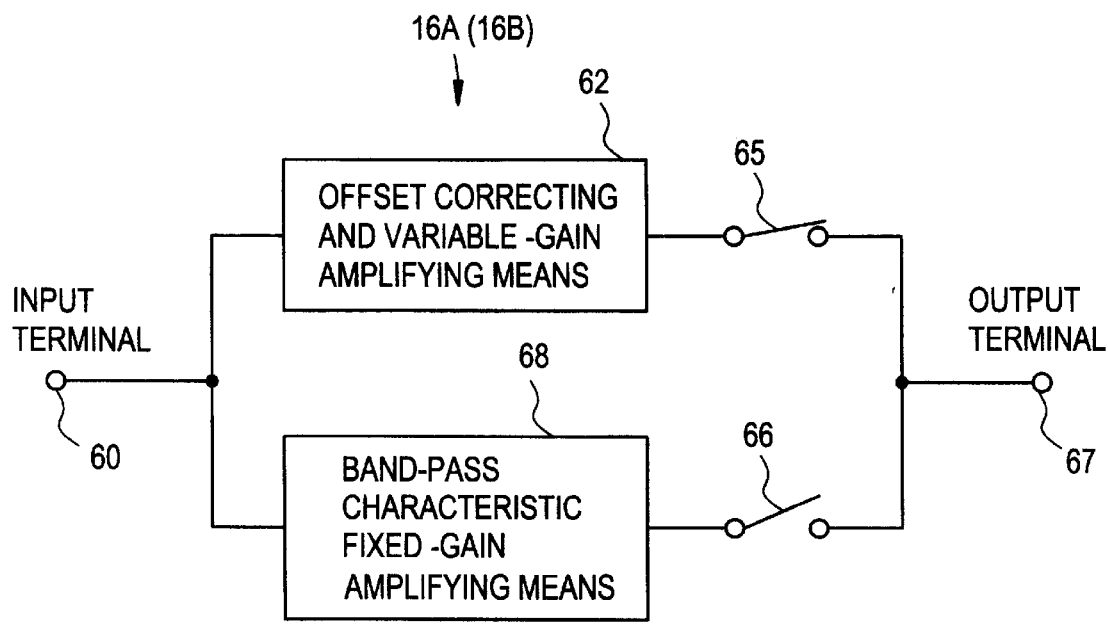
FIG. 19 is a block diagram illustrating the main portion of the eleventh preferred embodiment of a radio receiver according to the present invention.
Figure 20:
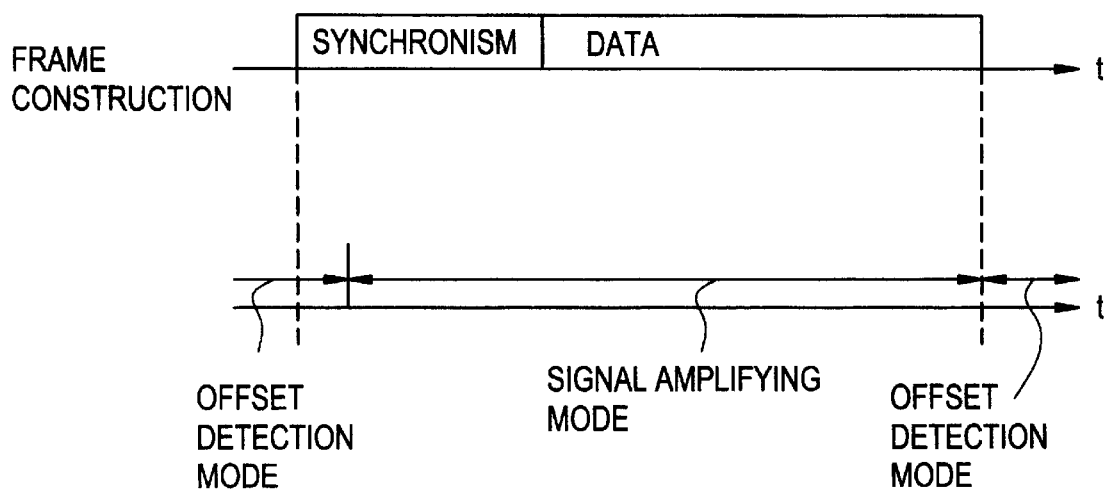
FIG. 20 is a view illustrating a frame construction of a signal received by a receiver of FIG. 19.

FIG. 19 illustrates the eleventh preferred embodiment of a variable-gain amplifier circuit according to the present invention. In a time-division multiplex communication system, it is required to continuously receive signals to wait for intermittently transmitted signals before communication. For example, in the case of the signal receiving in a digital cordless telephone, a signal of a frame having a length of $625/1000000$ seconds ($\mu$sec) per $5/1000$ seconds (5 msec) is received during call as shown in FIG. 20. Since the receiver has received the last frame, it is possible to switch the mode from the offset detection mode to the signal amplifying mode immediately before the next frame is commenced, by measuring the elapsed time. Therefore, the signal amplifying mode may be maintained for a period of time which is slightly longer than 625 $\mu$sec. However, since it is not discriminated when the signal to be received is commenced immediately after the power supply of the receiver is turned on, it is required to continuously wait for signals for a long period of time to receive a first signal. In the case of a digital cordless telephone, the frame of a control signal transmitted from a master receiver has the maximum interval of 150 msec. Immediately after the power supply is turned on, the receiver can not discriminate whether it is immediately before a frame is commenced or immediately after a frame ends, it is required to continuously wait for signals until a first signal is detected. However, if only the presence of signal is determined, there is no problem with respect to error rate like during call. Therefore, it is not required to accurately amplify all of the signal components, and a part of signal components may be caught.

In particular, as shown in FIG. 20, since the first portion of the frame contains a synchronizing signal for conducting clock synchronism, an amplifier circuit which can amplify a frequency component of a clock synchronizing signal may be used. Therefore, an amplifier circuit having a high-pass or band-pass characteristic which does not amplify the DC offset is designed to receive a radio signal, and it is switched to an amplifier circuit having an offset-corrected flat frequency characteristic after the signal is detected, so that it is possible to form a receiver which is not under the influence of the offset.

Then, in a radio receiver with a variable-gain amplifier circuit according to the present invention, a sequence control which is carried out until a synchronizing signal contained in a received signal is received immediately after the power supply is turned on when the signal is received by the time-division multiplex communication system as shown in FIG. 19, will be described.

Figure 21:
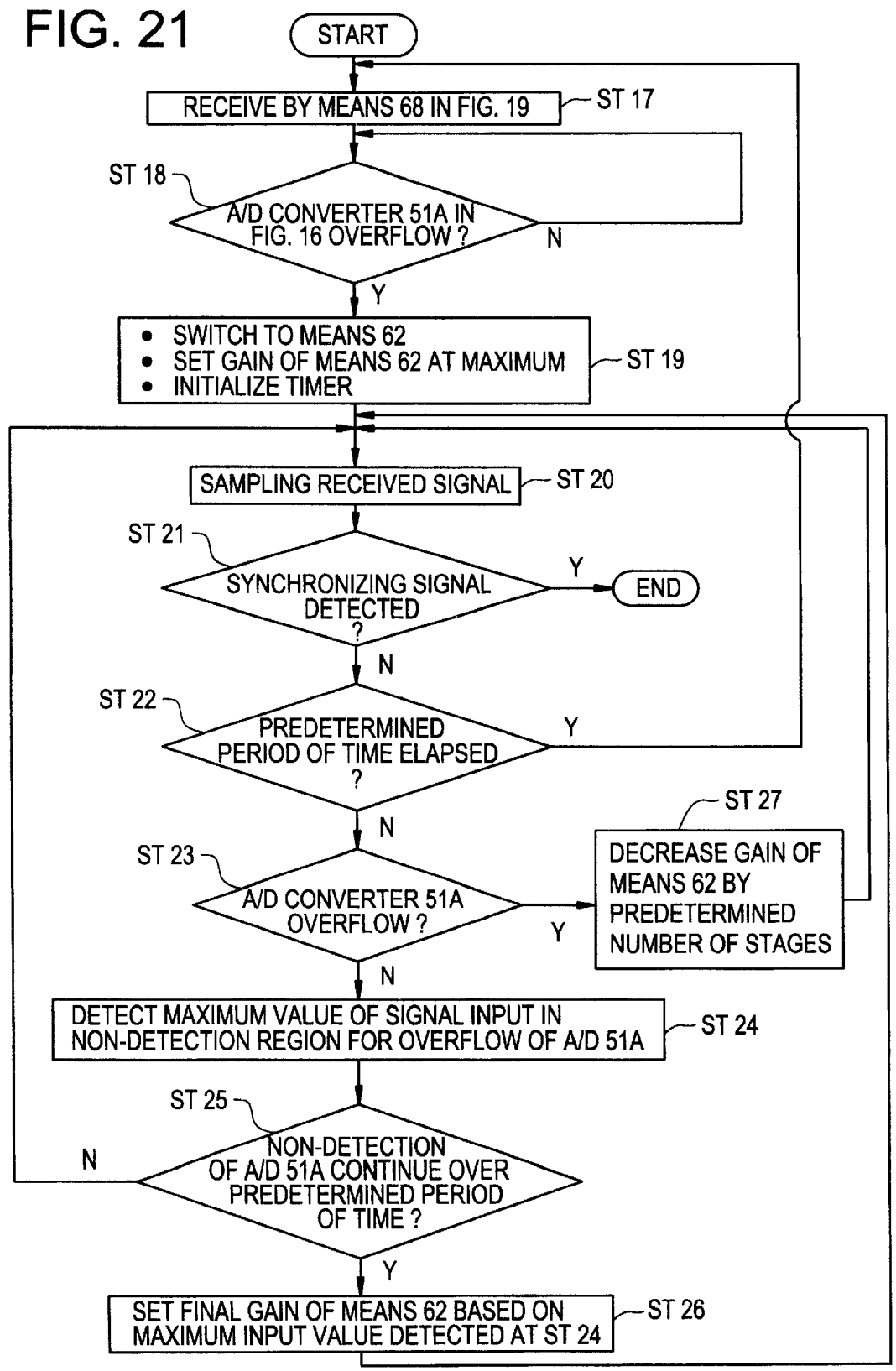
FIG. 21 is a flowchart of a receiving sequence in a time-division multiplex access (TDMA) in the radio receiver of FIG. 19.

FIG. 21 is a flowchart of a sequence control in a radio receiving method. In general, a receiver takes clock and frame synchronism with the system after receiving a synchronizing signal transmitted from a master station. Therefore, since the radio receiver is not synchronized with the system immediately after the power supply is turned on, it is not possible to discriminate when the received signal arrives at the radio receiver. Therefore, it is required to discriminate the arrival of the received signal. First, immediately after the power supply is turned on, the variable-gain amplifying means 16A and 16B are so set that the band-pass characteristic fixed-gain amplifying means 68 is used, and the receiver is in a receivable state for waiting for an arrival signal (ST17). The gain of the band-pass characteristic fixed-gain amplifying means 68 is so set that the downstream A/D converter 51A overflows when the signal arrives at the receiver and that the A/D converter 51A does not overflow in thermal noise of the receiver. When the signal from the master station arrives at the receiver, the received signal is amplified by means of the gain of the band-pass characteristic fixed-gain amplifying means 68, and the A/D converter downstream of the band-pass characteristic fixed-gain amplifying means 68 overflows. Therefore, the receiver can discriminate the arrival of the signal from the master station on the basis of the overflow of the A/D converter (ST18).

When the A/D converter overflows, the variable-gain amplifying means 16A and 16B are switched from the band-pass characteristic fixed-gain amplifying means 68 to the offset correcting and variable-gain amplifying means 62, and the gain of the offset correcting and variable-gain amplifying means 62 is set at the maximum gain. The gain of the offset correcting and variable-gain amplifying means 62 is set to be lower than the gain of the band-pass characteristic fixed-gain amplifying means 68. In addition, a timer is reset to be zero (ST19). The arrival received signal is amplified by the offset correcting and variable-gain amplifying means 62 to be sampled by means of the A/D converter 51A, and the received level is detected (ST20). If a desired synchronizing signal can be detected, the sequence control is completed, and the call state is commenced (ST21).

In a case where no synchronizing signal is detected a predetermined period of time after the A/D converter 51A overflows (ST22), it is determined that the overflow of the A/D converter 51A has been an error detection, and the routine returns to ST17 so that the receiver is in the arrival-signal waiting state again. At ST23, it is detected on the basis of the signal amplified by the offset correcting and variable-gain amplifying means 62 whether the A/D converter 51A overflows. When it is detected that the A/D converter 51A overflows, the gain of the offset correcting and variable-gain amplifying means 62 is too large, so that the gain is decreased by a predetermined number of stages to amplify the received signal again to be received (ST20). Furthermore, as the predetermined number of stages for decreasing the gain of the offset correcting and variable-gain amplifying means 62 at ST27 is increased, it is possible to quickly remove the overflow caused in the A/D converter (ST23) to cause the control flow be converged. However, when the number of stages is extremely decreased, the gain of the offset correcting and variable-gain amplifying means 62 is too small, so that the detection error is increased when the signal input level is detected at ST24.

Then, when it is determined at ST23 that the A/D converter 51A does not overflow, the routine goes to ST24 wherein the maximum level of the received signal is detected by means of the currently set gain. This detection is carried out for setting the gain of the offset correcting and variable-gain amplifying means 62 at the later ST26. At ST25, it is determined whether a predetermined period of time is elapsed while the overflow of the A/D converter 51A is not detected. This is a step for determining whether the gain of the offset correcting and variable-gain amplifying means 62 is optimum to the received signal level. That is, if the overflow of the A/D converter is not detected at ST23 in this stage, it is assumed that the gain of the offset correcting and variable-gain amplifying means 62 is set at the optimum value, so that the routine goes to ST26 wherein the gain is finally set and the received signal is sampled again (ST20). On the other hand, if the overflow of the A/D converter 51A is detected at ST25, the sampling of the received signal is carried out again by means of the currently set gain (ST29).

In accordance with the above sequence control, when it is confirmed that the gain of the offset correcting and variable-gain amplifying means 62 has been set at the optimum value and that the synchronizing signal contained in the received signal has been detected at ST21, the sequence control is completed.

According to this sequence control, it is possible to set the optimum gain for the variable-gain amplifying means 16 so as to correspond to the received signal level when the power supply is turned on, so that it is possible to suitably carry out the detection of the synchronizing signal and the receiving of the following information signal.

Figure 22:
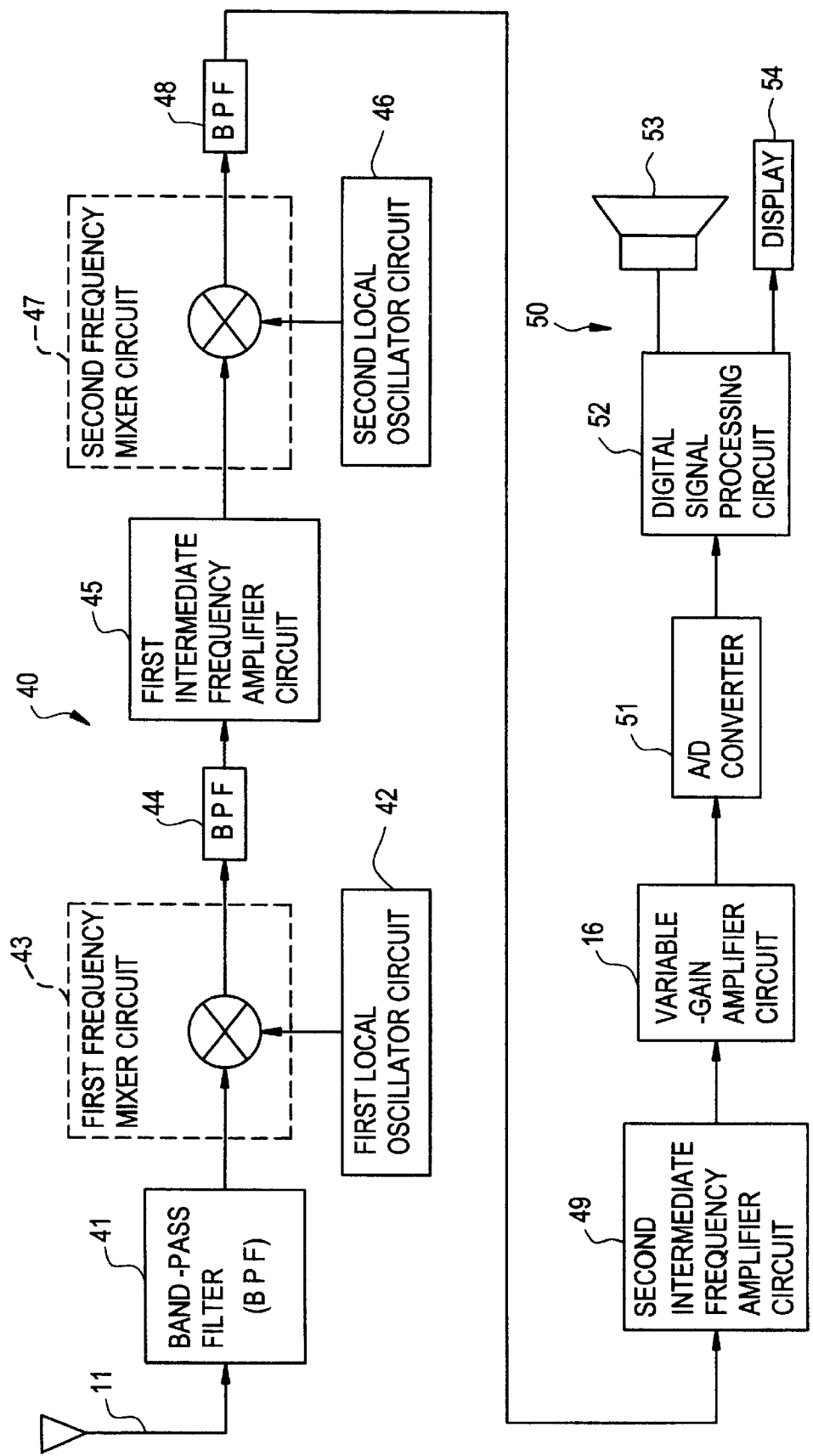
FIG. 22 is a block diagram illustrating the whole construction of the twelfth preferred embodiment of a receiver according to the present invention.

FIG. 22 is a block diagram of the twelfth preferred embodiment of a receiver 40 according to the present invention, which uses a superheterodyne receiving system. In this receiver, from a signal received through an antenna section 11, a signal component of a desired frequency band is selected to be amplified in a high-frequency signal processing section, and then, the frequency conversion is carried out in a first frequency converting section to output a first intermediate frequency signal. In addition, in a second intermediate frequency signal processing section, an unnecessary frequency component of the signal is removed and the signal is amplified. Thereafter, in a second intermediate frequency signal, the frequency conversion into a second intermediate frequency signal is carried out. In a second intermediate frequency processing section, an unnecessary frequency component of the second intermediate frequency signal is removed and the signal is amplified. Thereafter, the digital signal processing is carried out in the output section, and information such as voice and picture is outputted.

Referring to FIG. 22, as an embodiment of a radio receiver with a variable-gain amplifier circuit according to the present invention, the twelfth preferred embodiment of a radio receiver according to the present invention will be described below.

FIG. 22 shows a radio receiver of a double super system, in which a variable-gain amplifier circuit of the present invention is built. In FIG. 22, a radio receiver 40 comprises a band-pass filter (BPF) connected to an antenna 11, a frequency mixer circuit 43 for mixing a signal output of the BPF 41 with a local signal of a first local oscillator circuit, a BPF 44, a first intermediate frequency amplifier circuit 45, a second frequency mixer circuit 47 for mixing an output of a second local oscillator circuit 46 with an output of the first intermediate amplifier circuit 45, a BPF 48, a second intermediate amplifier circuit 49, and a variable-gain amplifier circuit 16. A signal processing section 50 is provided downstream of this radio receiver 40. The signal processing section 50 comprises an A/D converter for converting an analog signal to a digital signal, a digital signal processing circuit 52 for carrying out processes such as modulation into the converted digital signal or demodulation to derive a desired signal, a speaker 53 for outputting voice information on the basis of the output of the digital signal processing circuit 52, and a display 54 for outputting and displaying character or picture information.

In such a radio receiver as shown in FIG. 22, when the variable-gain amplifier circuit 16 is in the offset detection mode, the supply of the radio or intermediate frequency signal to the frequency mixer circuits 43 and 47 is interrupted, and the DC offset produced in the signal line extending from the frequency mixer circuit 43 or 47, in which the signal input is interrupted, to the variable-gain amplifier circuit 16, is retained by offset retaining means provided in the circuit 16.

Figure 23:
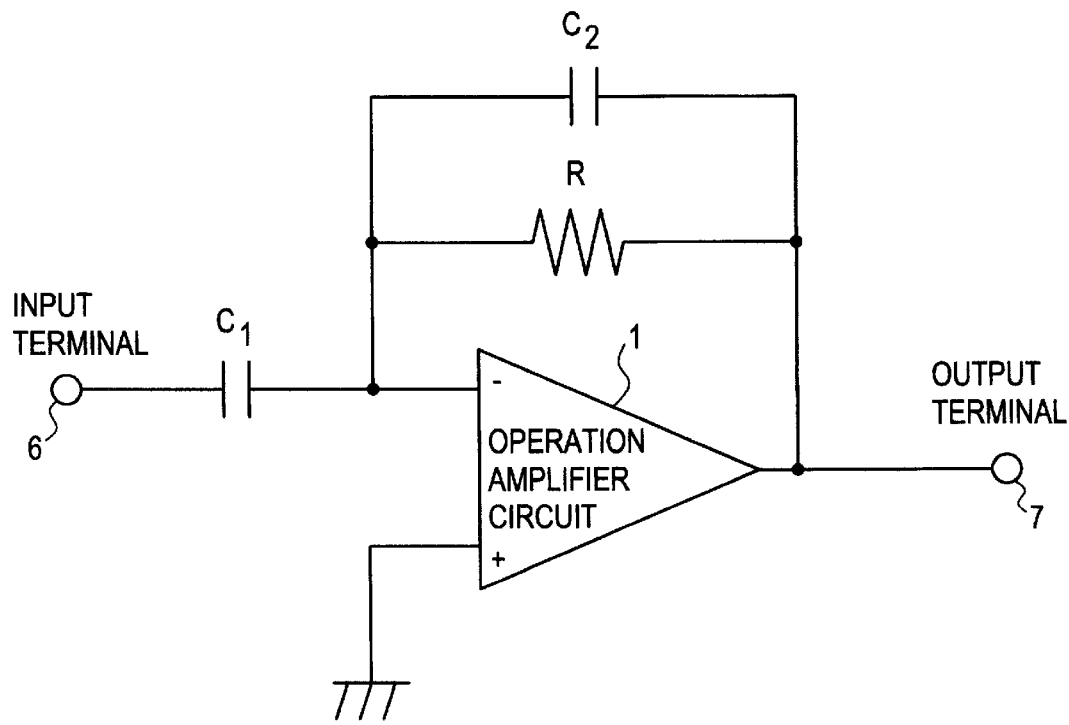
FIG. 23 is a block diagram of an embodiments of a variable-gain amplifier circuit having a band-pass characteristic in a radio receiver according to the present invention.
Figure 24:
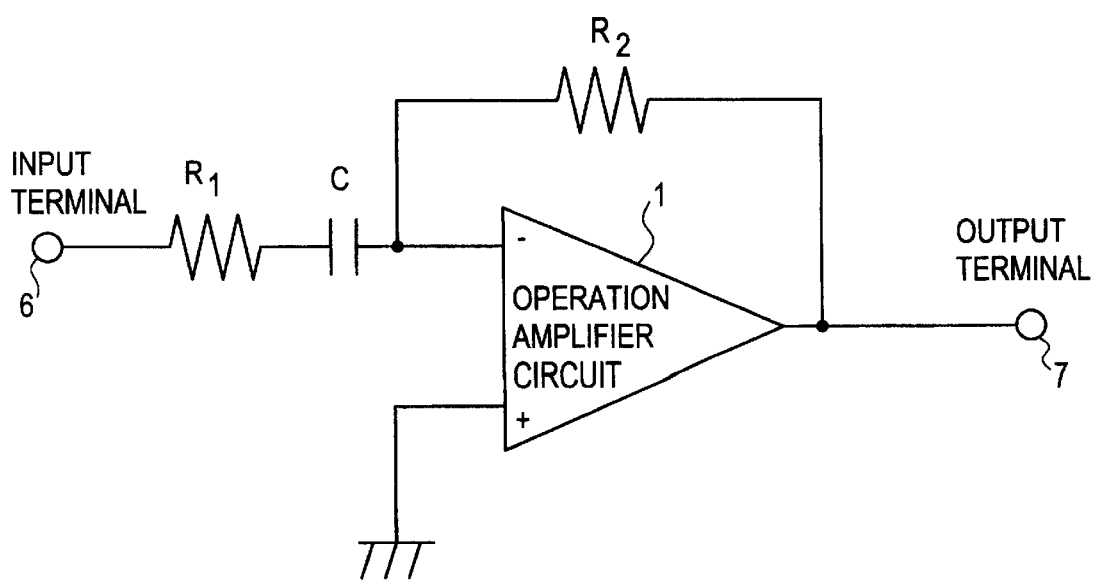
FIG. 24 is a block diagram of another embodiments of a variable-gain amplifier circuit having a band-pass characteristic in a radio receiver according to the present invention.

FIGS. 23 and 24 show embodiments of an amplifier circuit having a band-pass characteristic. If the operation amplifier circuit 1 is an ideal operation amplifier circuit, the circuits of FIGS. 23 and 24 have a high-pass characteristic. However, since the practical operation amplifier circuit has a low-pass characteristic, it has a band-pass characteristic as a whole.

Figure 25:
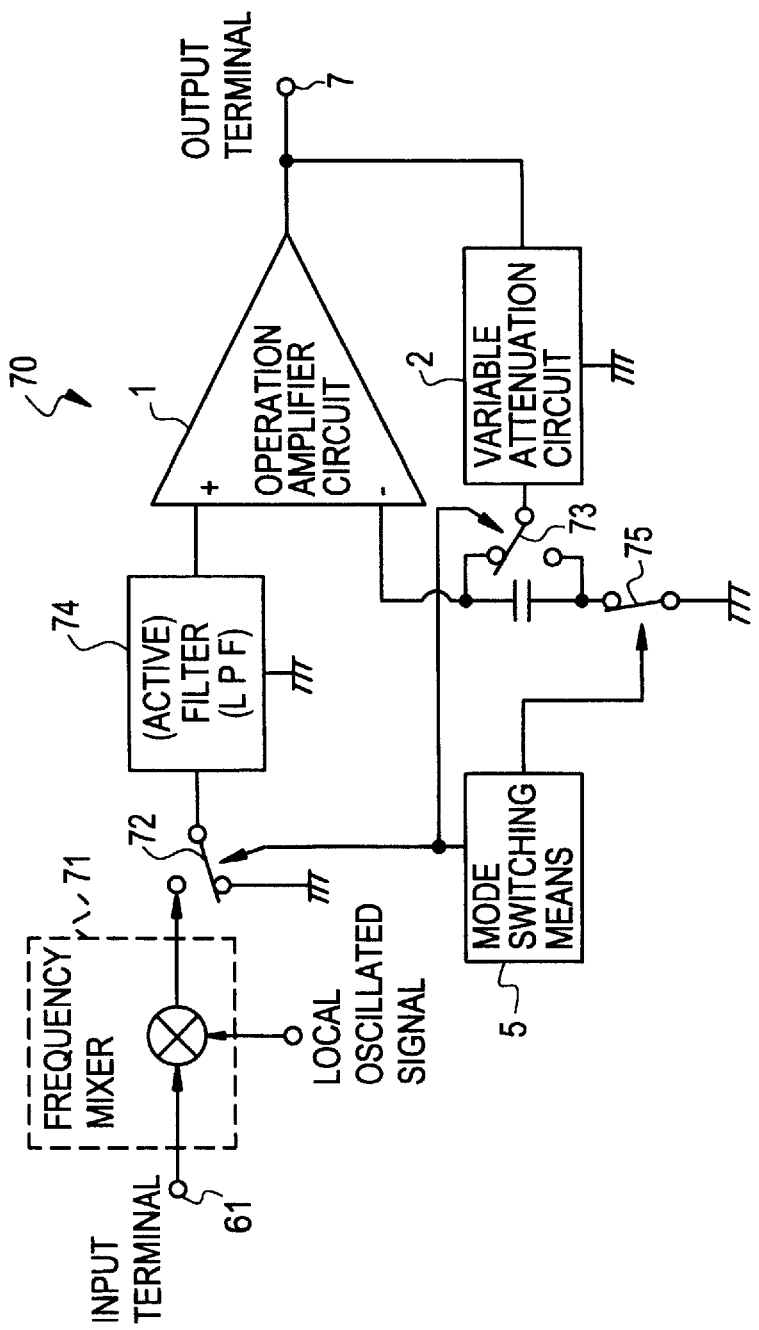
FIG. 25 is a block diagram of the thirteenth preferred embodiment of a radio receiver according to the present invention.

FIG. 25 shows the thirteenth preferred embodiment of a radio receiver with a variable-gain amplifier circuit according to the present invention. This shows a part of a receiver 70 in which the output of a frequency mixer circuit 71 for mixing a radio signal supplied through an input terminal 60 with a local oscillated signal, is inputted to take out only a signal of a required frequency to amplify the signal to a suitable level. The shown state is the offset detection mode. Similar to the amplifier circuit 1, an offset appears in the output of a low-pass filter 74 comprising an active element. As shown in FIG. 24, the sum of the output offset voltage of a filter 74 and the input offset voltage of the operation amplifier circuit 1 is charged in an offset retaining capacity by interrupting the input from the frequency mixer circuit 71 by means of a switch 72. In the gain amplifying mode, it is possible to obtain a signal in which the offsets of the filter 74 and the operation amplifier circuit 1 are corrected. Furthermore, the reference numbers 73 and 75 denote switches.

Figure 26:
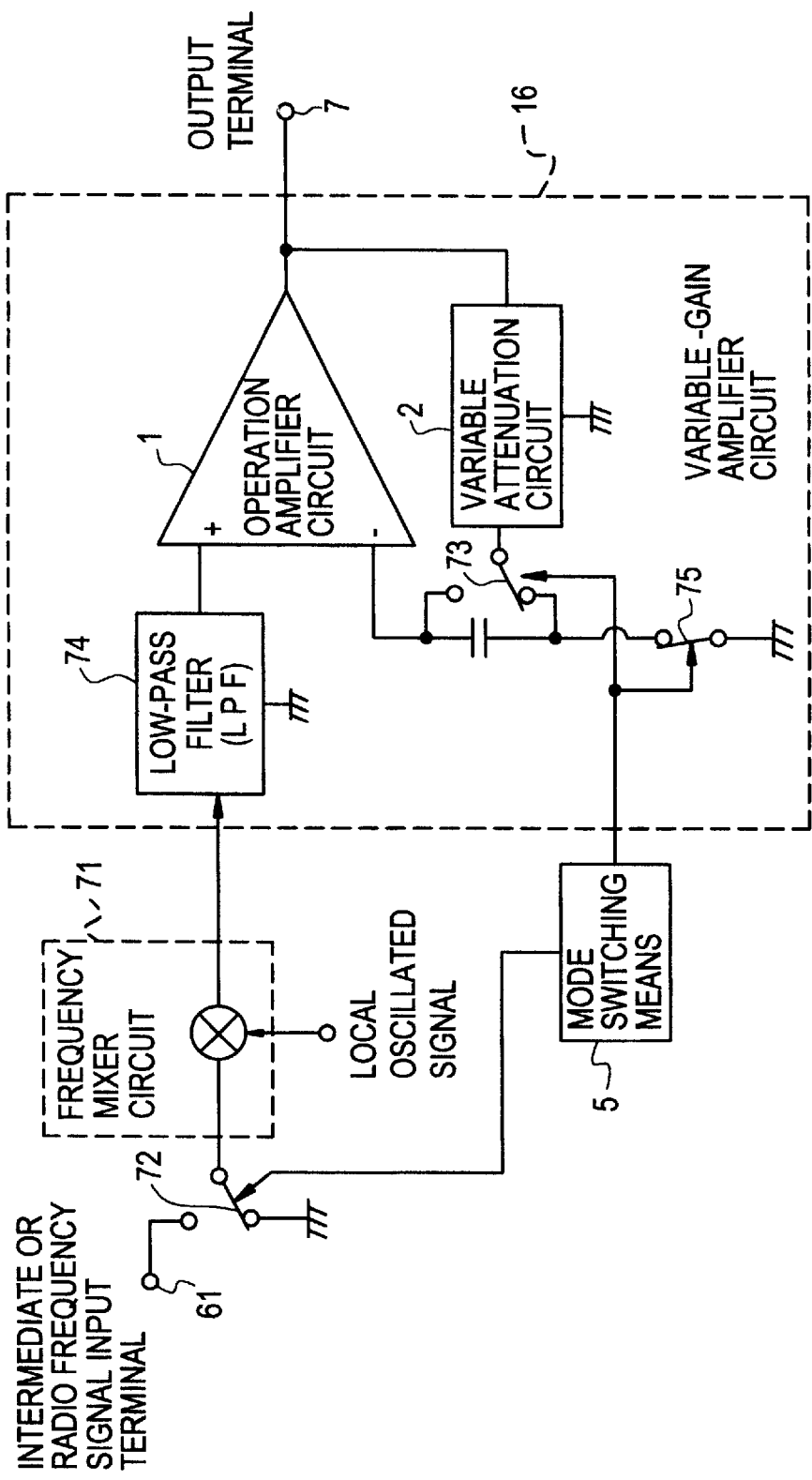
FIG. 26 is a block diagram of the fourteenth preferred embodiment of a radio receiver according to the present invention.

FIG. 26 shows the fourteenth preferred embodiment of a radio receiver with a variable-gain amplifier circuit according to the present invention. In this embodiment, it is possible to correct the output offset of the frequency mixer circuit 71, the offset of the low-pass filter 74 and the input offset of the operation amplifier circuit 1 by interrupting the input of the frequency mixer circuit 71 by means of the switch 72 in the offset detection mode.

Figure 27:
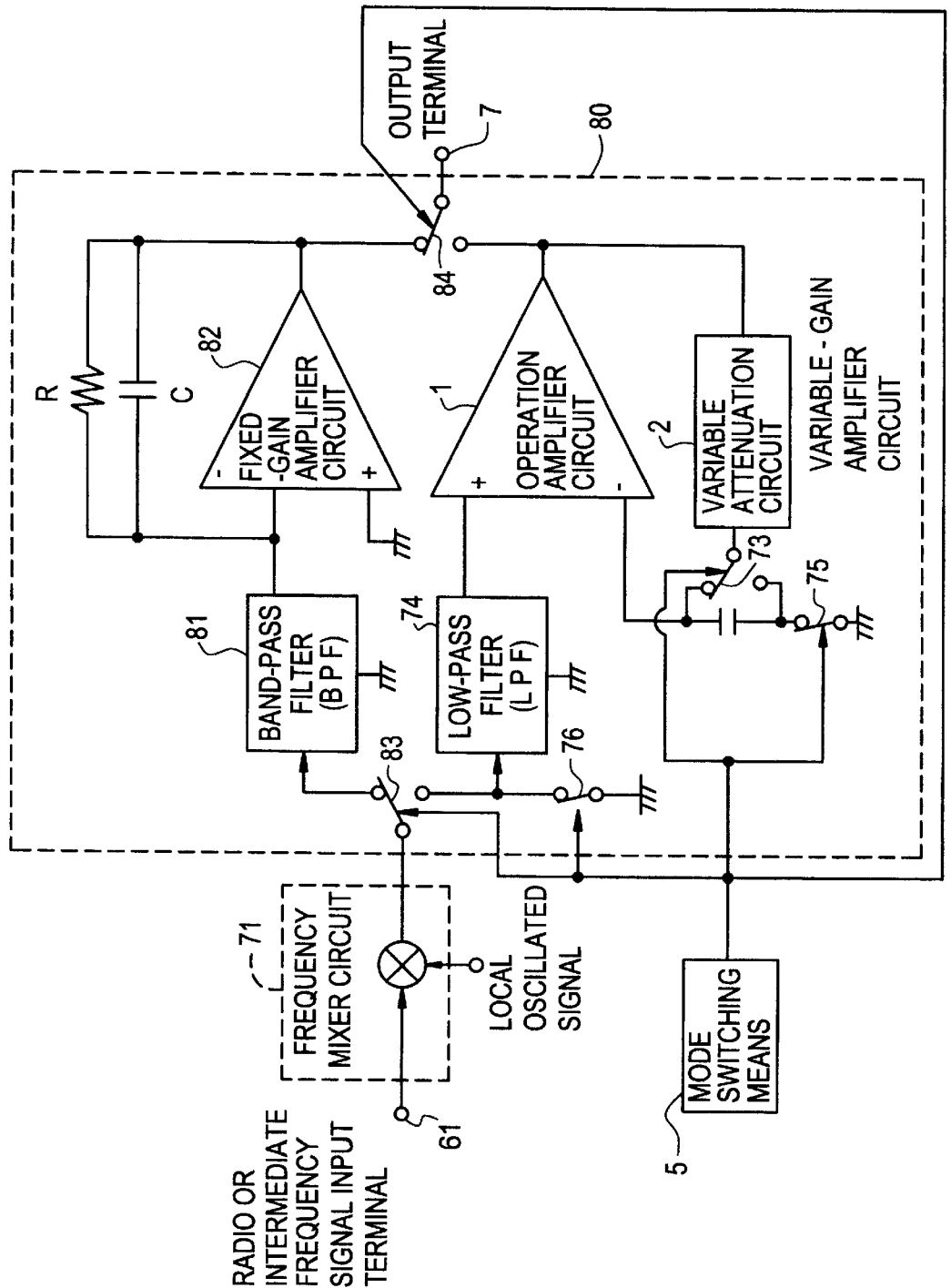
FIG. 27 is a block diagram of the fifteenth preferred embodiment of a radio receiver according to the present invention.

FIG. 27 shows the fifteenth preferred embodiment of a radio receiver with a variable-gain amplifier circuit according to the present invention. As mentioned above, in the time-division multiplex system, it is required to maintain the signal waiting state for a long period of time immediately after the power supply of the receiver is turned on. Therefore, a band-pass filter (BPF) 81 for detecting signals and a fixed-gain amplifier circuit 82 are used in this preferred embodiment. In FIG. 27, switches 83 and 84 are in the signal waiting state, and a variable-gain amplifier circuit 80 is in the offset detection mode. The band-pass filter 81 is designed to restrain a signal in the adjacent channel, to prevent a direct current containing an offset from passing, and to allow a clock synchronizing signal to pass. After detecting the signal, the switches 83 and 84 are switched, and the offset corrected signal is received by the low-pass filter 74 and the operation amplifier circuit 1.

Figure 28:
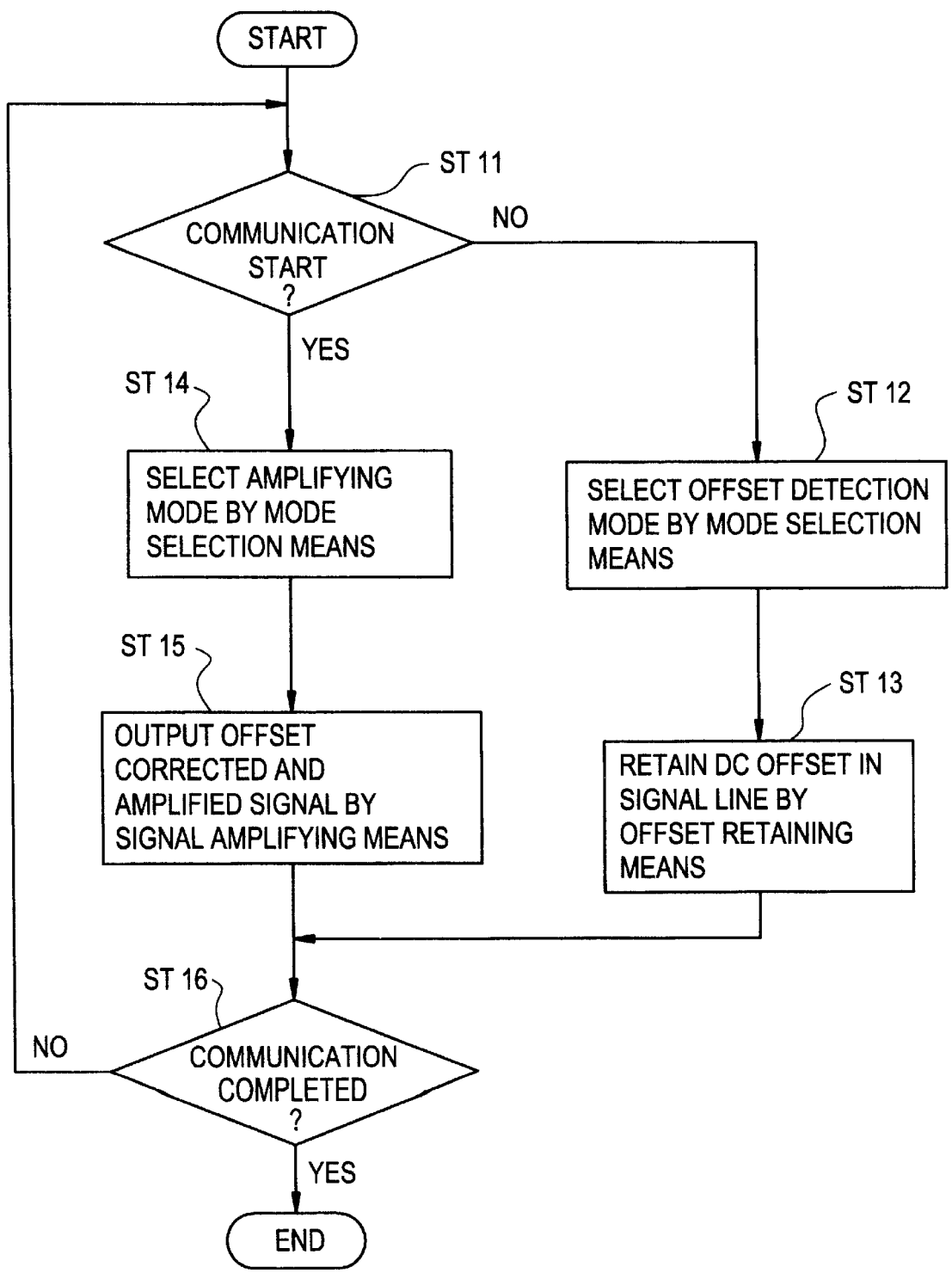
FIG. 28 is a flowchart showing the basic concept of a radio receiving method in a radio receiver with a variable-gain amplifier circuit according to the present invention.

Then, referring to FIG. 28, a radio receiving method in the radio receiver equipped with the variable-gain amplifier circuit having the aforementioned basic construction will be described in detail. FIG. 28 is a flowchart showing the sixteenth preferred embodiment of a radio receiving method according to the present invention. As shown in FIG. 28, it is determined at step ST11 whether a radio receiver having any one of the aforementioned constructions is in a communication state. When it is determined at step ST11 that the radio receiver does not receive radio signals, the routine goes to step ST12 wherein the offset detection mode is selected by the mode selection means of the variable-gain amplifier circuit. Then, at step ST13, the DC offset in the signal line is retained by the offset retaining means.

On the other hand, when it is determined at step ST11 that the radio receiver receives signals, the routine goes to step ST14 wherein the amplifying mode is selected by the mode selection means. Then, at step ST15, the offset corrected and amplified signal is outputted by the signal amplifying means. Thereafter, it is determined at step ST16 whether the communication is completed. When it is determined that the communication is not completed, the steps after ST11 are repeated. When it is determined that the communication is completed, the processing steps of the radio receiving method are completed.

As mentioned above, according to the present invention, it is possible to provide a variable-gain amplifier circuit for correcting DC offsets. In addition, when this variable-gain amplifier circuit is used for a radio receiver, it is possible to obtain a signal wherein a DC offset containing offsets produced in a frequency converting circuit and a channel selecting filter is corrected, and it is possible to correct an input offset of a variable-gain amplifier circuit, together with offsets produced in a frequency mixer circuit and a filter, at the same time.

Moreover, in the case of a radio receiver applied to a time-division multiplex system, it is possible to prevent an offset retaining capacity from being discharged due to the waiting for a received signal for a long period of time, by using an amplifier circuit having a band-pass characteristic when waiting for the received signal and by using an offset-corrected variable-gain amplifier circuit after detecting the signal.

What is claimed is:

1. A variable-gain amplifier circuit for processing a continuous time signal, comprising:

signal amplifying means for amplifying an input signal;

gain control means for controlling a gain of said signal amplifying means;

mode selection means for selecting any one of a signal amplifying mode in which said input signal is amplified by a predetermined gain, and said offset detection mode in which an offset of said signal amplifying means is detected, so as to change an output signal according to said input signal in said signal amplifying mode, and to shut off said input signal in said offset detection mode;

offset retaining means for retaining the offset detected by said signal amplifying means; and mode switching means for allowing an input offset of said signal amplifying means to be inputted to said offset retaining means in said offset detection mode and for allowing a signal derived by subtracting an output of said offset retaining means to be inputted to said signal amplifying means in said signal amplifying mode, so as to produce a control signal for correcting said offset.

2. A variable-gain amplifier circuit as set forth in claim 1, wherein said signal amplifying means comprises an operation amplifier for inputting said input signal to one of a positive input or a negative input and for inputting an output of said gain control means to the other input.

3. A variable-gain amplifier circuit as set forth in claim 1, wherein said gain control means comprises a variable attenuation circuit for setting and supplying a desired quantity of attenuation to an input of said signal amplifier circuit.

4. An offset control method in a variable-gain amplifier circuit which comprises signal amplifying means for amplifying an input signal, gain control means for controlling a gain of said signal amplifying means, mode selection means for selecting any one of a signal amplifying mode in which said input signal is amplified by a predetermined gain and an offset detection mode in which an offset of said signal amplifying means is detected, offset retaining means for retaining the detected offset, and mode switching means for allowing an input offset of said signal amplifying means to be inputted to said offset retaining means and for shutting off said input signal in said offset detection mode and for allowing a signal derived by subtracting an output of said offset retaining means to be inputted to said signal amplifying means in said signal amplifying mode, so as to produce a control signal for correcting said offset, said offset control method comprising the steps of:

controlling a gain of said gain control means so that the detection sensitivity of the quantity of offset of said signal amplifying means is optimum after a power supply is turned on and in the case of the offset detection mode;

detecting the quantity of offset of said signal amplifying means while being controlled so that said detection sensitivity of the quantity of offset is optimum, and retaining the quantity of offset by said offset retaining means;

controlling said gain of said gain control means in accordance with the amplitude of an input signal after said offset detection mode is switched to said signal amplifying mode by said mode selection means; and amplifying and outputting said input signal in accordance with said controlled gain by said signal amplifying means.

5. A radio receiver with a variable-gain amplifier circuit, comprising:

a radio frequency amplifier circuit for amplifying an input signal of a radio frequency;

a signal supply selecting circuit for determining whether said input signal is supplied;

a frequency mixer circuit for mixing frequencies of said input signal; and a variable-gain amplifier circuit which comprises signal amplifying means for amplifying an input signal, gain control means for controlling a gain of said signal amplifying means, mode selection means for selecting any one of a signal amplifying mode in which said input signal is amplified by a predetermined gain and an offset detection mode in which an offset of said signal amplifying means is detected, offset retaining means for retaining the detected offset, and mode switching means for allowing an input offset of said signal amplifying means to be inputted to said offset retaining means in said offset detection mode and for allowing a signal derived by subtracting an output of said offset retaining means to be inputted to said signal amplifying means in said signal amplifying mode, so as to produce a control signal for correcting said offset, wherein said signal supply selecting circuit interrupts said input signal inputted to said frequency mixer circuit in said offset detection mode, and said offset retaining means retains a DC offset produced in a signal line extending from said frequency mixer circuit, in which the signal input is interrupted, to said variable-gain amplifier circuit.

6. A radio receiver with a variable-gain amplifier circuit as set forth in claim 5 wherein at least two variable-gain amplifier circuits which are the same as said variable-gain amplifier circuit are provided, and wherein when one of said variable-gain amplifier circuits operates in the offset detection mode, the other variable-gain amplifier circuit operates in the signal amplifying mode, and when the other variable-gain amplifier circuit operates in the offset detection mode, the one variable-gain amplifier circuit operates in the signal amplifying mode, so that a radio frequency signal is continuously received by means of said radio frequency amplifier circuit.

7. A radio receiver with a variable-gain amplifier circuit as set forth in claim 5, wherein said radio receiver is applied to a time-division multiplex access (TDMA) system, said radio receiver further comprising, in addition to said variable-gain amplifier circuit, a fixed-gain amplifier circuit having a band-pass characteristic for amplifying a frequency component of at least a clock synchronizing signal included in a reception signal, and a switching circuit for switching the signal supplying direction between the reception signal supply to the fixed-gain amplifier circuit and the reception signal supply to said variable-gain amplifier circuit, wherein said fixed-gain amplifier circuit detects a signal within a predetermined period of time after said radio frequency amplifier circuit receives said radio frequency signal, and the signal supplying direction is switched by a switching circuit after said predetermined period of time, so that said variable-gain amplifier circuit outputs a signal of an offset-corrected flat frequency characteristic.

8. A radio receiver as set forth in claim 5, wherein said variable-gain amplifier circuit comprises signal amplifying means including an operation amplifier for inputting said input signal to one of a positive input and a negative input and for inputting an output of said gain control means to the other input.

9. A radio receiver as set forth in claim 5, wherein said variable-gain amplifier circuit comprises gain control means including a variable attenuation circuit for setting and supplying a desired quantity of attenuation to an input of said signal amplifier circuit.

10. A radio receiving method in a radio receiver which comprises: a radio frequency amplifier circuit for amplifying a radio frequency input signal; a signal supply selecting circuit for determining whether said input signal is supplied; a frequency mixer circuit for mixing frequencies of said input signal; and a variable-gain amplifier circuit which comprises signal amplifying means for amplifying an input signal, gain control means for controlling a gain of said signal amplifying means, mode selection means for selecting any one of a signal amplifying mode in which amplifying said input signal is amplified by a predetermined gain and an offset detection mode in which an offset of said signal amplifying means is detected, offset retaining means for retaining the detected offset, and mode switching means for allowing an input offset of said signal amplifying means to be inputted to said offset retaining means in said offset detection mode and for allowing a signal derived by subtracting an output of said offset retaining means to be inputted to said signal amplifying means in said signal amplifying mode, so as to produce a control signal for correcting said offset, wherein a signal interrupting circuit interrupts said input signal inputted to said frequency mixer circuit in said offset detection mode, and said offset retaining means retains a DC offset produced in a signal line extending from said frequency mixer circuit, in which the signal input is interrupted, to said variable-gain amplifier circuit, said radio receiving method comprising the steps of:

selecting said offset detection mode by said mode selection means when said radio receiver does not carry out communication, and retaining a DC offset produced in said signal line by said offset retaining means; and selecting said amplifying mode by said mode selection means when said radio receiver carries out communication, and outputting an offset-corrected and amplified signal by said signal amplifying means.

* * * * *